United States Patent
Steensgaard-Madsen

(10) Patent No.: US 10,790,840 B2
(45) Date of Patent: Sep. 29, 2020

(54) PIPELINED-INTERPOLATING ANALOG-TO-DIGITAL CONVERTER

(71) Applicant: Analog Devices International Unlimited Company, Limerick (IE)

(72) Inventor: Jesper Steensgaard-Madsen, Sequim, WA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/684,263

(22) Filed: Nov. 14, 2019

(65) Prior Publication Data

US 2020/0162086 A1 May 21, 2020

Related U.S. Application Data

(60) Provisional application No. 62/768,021, filed on Nov. 15, 2018.

(51) Int. Cl.
| | |
|---|---|
| *H03M 1/06* | (2006.01) |
| *H03M 1/10* | (2006.01) |
| *H03M 1/20* | (2006.01) |

(52) U.S. Cl.
CPC ......... *H03M 1/0602* (2013.01); *H03M 1/067* (2013.01); *H03M 1/0639* (2013.01); *H03M 1/1004* (2013.01); *H03M 1/201* (2013.01)

(58) Field of Classification Search
None
See application file for complete search history.

(56) References Cited

U.S. PATENT DOCUMENTS

| | | | |
|---|---|---|---|
| 7,557,746 B1 | 7/2009 | Waltari | |
| 7,893,858 B2 | 2/2011 | Hojabri et al. | |
| 8,063,811 B2 | 11/2011 | Hojabri et al. | |
| 9,843,337 B1* | 12/2017 | Li ..................... | H03M 1/0673 |
| 2008/0174461 A1* | 7/2008 | Hsu .................... | H03M 1/1061 341/118 |
| 2010/0060496 A1* | 3/2010 | Madisetti ............ | H03M 1/0624 341/118 |
| 2014/0320192 A1 | 10/2014 | Hamada et al. | |
| 2017/0041013 A1* | 2/2017 | Nagarajan ........... | H03M 1/0641 |

OTHER PUBLICATIONS

Brannon, Brad, Overcoming Converter Nonlinearities with Dither, Analog Devices Application Note AN-410 (Year: 1996).*
McNeill et al., *Digital Background-Calibration Algorithm for "Split ADC" Architecture*, IEEE Transactions on Circuits and Systems—I: Regular Papers, vol. 56, No. 2, Feb. 2009, 13 pages.

(Continued)

*Primary Examiner* — Howard Williams
(74) *Attorney, Agent, or Firm* — Patent Capital Group

(57) ABSTRACT

Analog-to-digital converter (ADC) circuitry to convert an analog signal to a digital signal is disclosed herein. The ADC circuitry can utilize pipelined-interpolation analog-to-digital converters (PIADCs) with adaptation circuitry to correct regenerative amplification cells of the PIADCs. The PIADCs can implement a rotational shuffling scheme for correction of the regenerative amplification cells, where the correction implemented by the regenerative amplification cells allows for offsetting of latches of the regenerative amplification cells.

18 Claims, 7 Drawing Sheets

(56) References Cited

OTHER PUBLICATIONS

Kim et al., *A 6-b 4.1-GS/s Flash ADC with Time-Domain Latch Interpolation in 90-nm CMOS*, IEEE Journal of Solid-State Circuits, vol. 48, No. 6, Jun. 2013, 13 pages.
Kim et al., *A 65 nm CMOS 7b 2 GS/s 20.7 mW Flash ADC with Cascaded Latch Interpolation*, IEEE Journal of Solid-State Circuits, vol. 50, No. 10, Oct. 2015, 12 pages.
McNeill et al., *"Split ADC" Architecture for Deterministic Digital Background Calibration of a 16-bit 1-MS/s ADC*, IEEE Journal of Solid-State Circuits, vol. 40, No. 12, Dec. 2005, 9 pages.
*8 bit ADC*, Illinois.edu, 13 pages.
Lin et al., *An Ultra-Low-Voltage 160 MS/s 7 Bit Interpolated Pipeline ADC Using Dynamic Amplifiers*, IEEE Journal of Solid-State Circuits, vol. 50, No. 6, Jun. 2015, 13 pages.
Li, *Design of High Speed Folding and Interpolating Analog-to-Digital Converter*, A Dissertation, Texas A&M University, May 2003, 177 pages.
Caralis et al., *A 400Msample/s, 8-bit, CMOS Folding and Interpolating Analog-to-Digital Converter*, EECS 598, Winter 2004, 5 pages.
Genov et al., *Dynamic MOS Sigmoid Array Folding Analog-to-Digital Conversion*, IEEE Transactions on Circuits and Systems—I: Fundamental Theory and Applications, 5 pages.
Coady, *Pipelined Multi-Step Interpolating A/D Converter*, Massachusetts Institute of Technology, May 1995, 97 pages.
Paik et al., *A 0.55 V 7-bit 160 MS/s Interpolated Pipeline ADC Using Dynamic Amplifiers*, 978-1-4673-6146-0/13 © 2013 IEEE, 4 pages.

* cited by examiner

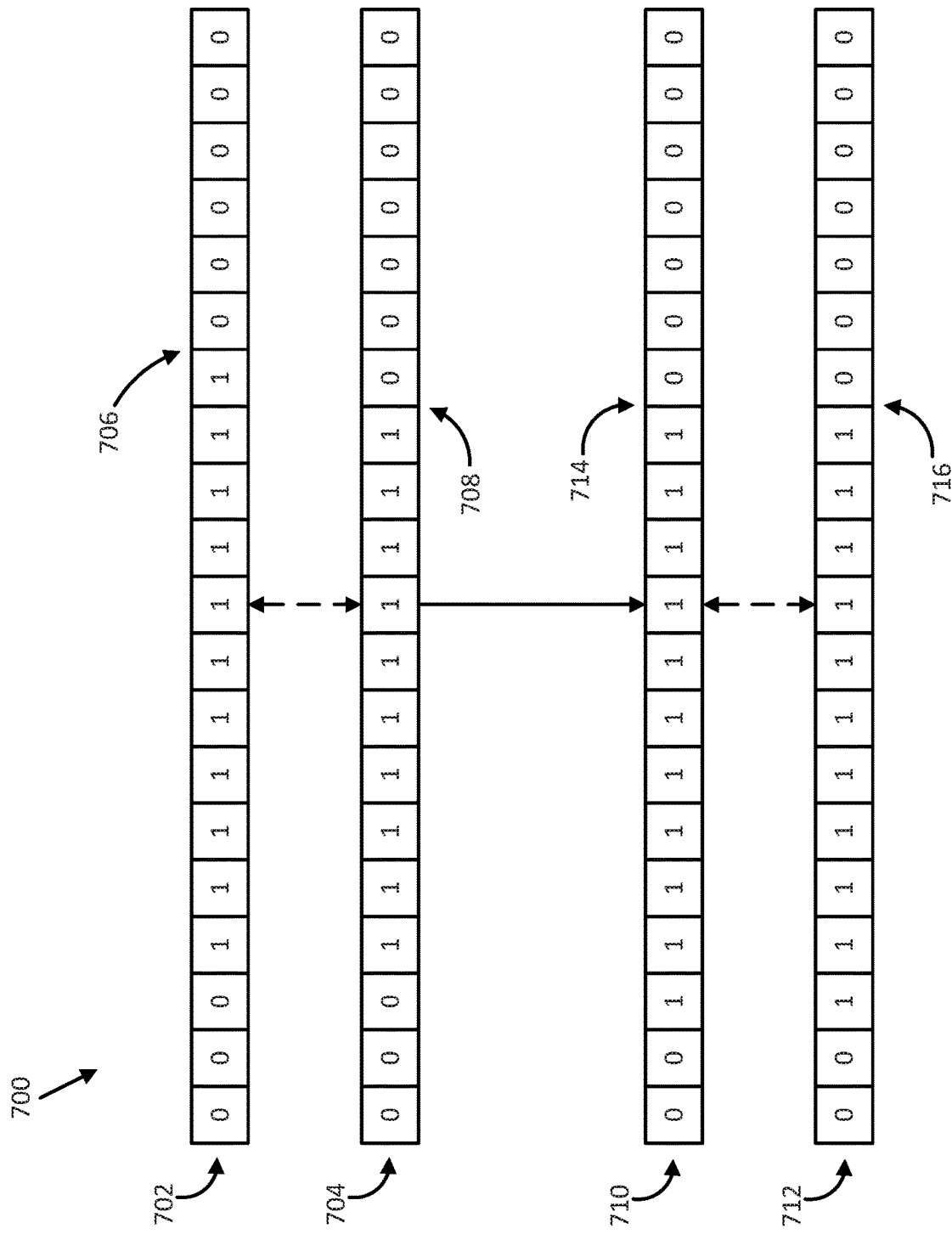

PIPELINED-INTERPOLATING ANALOG-TO-DIGITAL CONVERTER

RELATED APPLICATIONS

The present disclosure claims priority to U.S. provisional application No. 62/768,021 entitled "PIPELINED-INTERPOLATING ADC" and filed Nov. 15, 2018, the disclosure of which is incorporated by reference in its entirety.

FIELD OF THE DISCLOSURE

This disclosure relates in general to the field of analog-to-digital converters, and more particularly, though not exclusively, to a pipelined-interpolating analog-to-digital converter utilizing regenerative amplification cells.

BACKGROUND

Analog signals can be produced in various kinds of circuit elements, e.g., signal generators, sensors, and antennas. However, there can be many instances where having digital signals can be beneficial, such as for the processing of the signals. To utilize the benefits of having a digital signal when an analog signal has been produced, analog-to-digital converters (ADCs) have been developed to convert the analog signal into a digital signal.

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications across various fields. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIG. 7 illustrates another example thermometer code correction instance, according to various embodiments of the disclosure.

SUMMARY OF THE DISCLOSURE

Figure 1:
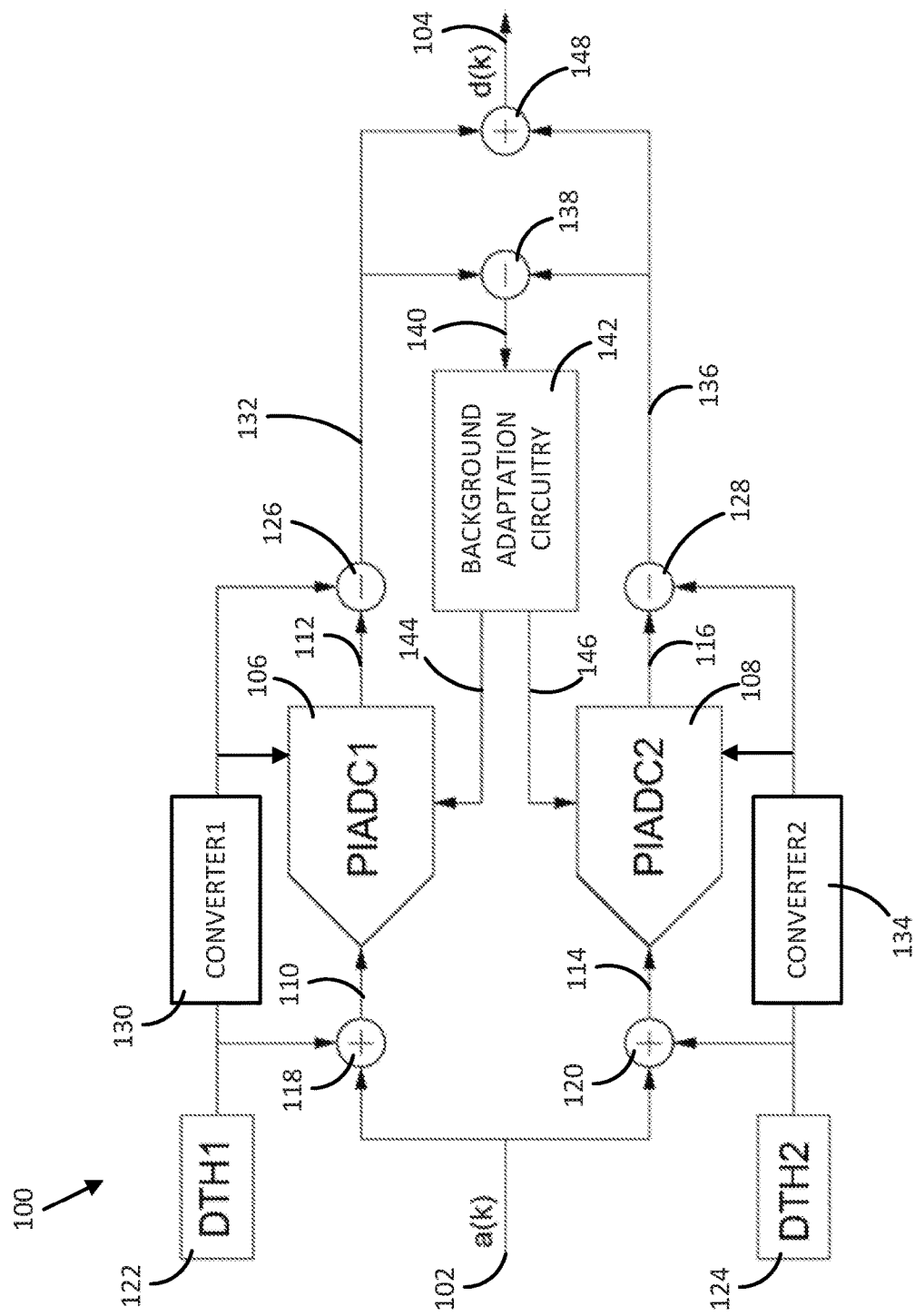
FIG. 1 illustrates an example analog-to-digital converter circuitry, according to various embodiments of the disclosure.

Analog-to-digital converter (ADC) circuitry to convert an analog signal to a digital signal is disclosed herein. The ADC circuitry can utilize pipelined-interpolation analog-to-digital converters (PIADCs) with adaptation circuitry to correct an offset of the PIADCs. For example, the adaptation circuitry can correct regenerative amplification (RA) cells or other circuitry of the PIADCs to adjust the offset of the PIADC. The PIADCs has a transparent dither injected at the input and removed at the output. The PIADCs can utilize a rotational shuffling scheme to shuffle reference values in a PIADC to enable calibration of the RA cells. In some cases, the correction of the RA cells includes partial shifting of balance of latches of the RA cells.

According to some embodiments disclosed herein, a pipelined-interpolating analog-to-digital converter (PIADC) may include a plurality of nodes to receive a combined signal having an analog input signal and a dither signal. The plurality of nodes may include a first node to output a first difference between a first selected value and the combined signal on a first output of the plurality of nodes, a second node to output a second difference between a second selected value and the combined signal on a second output of the plurality of nodes, and a third node to output a third difference between a third selected value and the combined signal on a third output of the plurality of nodes, wherein the first selected value, the second selected value, and the third selected value are selected from a set of unique values based on a rotational shuffling scheme and the dither signal. The PIADC may further include a tree of regenerative amplification cells coupled to the first output, the second output, and the third output of the plurality of nodes, wherein the tree is to produce a thermometer code word corresponding to a sample of the combined signal, wherein the tree is to receive an indication whether any of the regenerative amplification cells are to be corrected based on the thermometer code word.

According to some embodiments disclosed herein, analog-to-digital converter (ADC) circuitry may include a pipelined-interpolating analog-to-digital converter (PIADC), addition circuitry coupled to an input of the PIADC, the addition circuitry to sum an analog input signal and a dither signal to produce a combined signal and to provide the combined signal to the input of the PIADC, and subtraction circuitry coupled to an output of the PIADC, the subtraction circuitry to subtract the dither signal from an output signal on the output of the PIADC to produce a digital representation of the analog input signal.

According to some embodiments disclosed herein, analog-to-digital converter (ADC) circuitry may include a first pipelined-interpolating analog-to-digital converter (PIADC) to receive a first combined signal, the first combined signal having an analog input signal and a first dither signal, wherein the first PIADC is to produce a first thermometer code word based on the first combined signal, the first thermometer code word utilized to produce a first digital representation of the analog input signal, and a second PIADC to receive a second combined signal, the second combined signal having the analog input signal and a second dither signal, wherein the second PIADC is to produce a second thermometer code word based on the second combined signal, the second thermometer code word utilized to produce a second digital representation of the analog input signal. The ADC circuitry may further include background adaptation circuitry coupled to the first PIADC and the second PIADC, the background adaptation circuitry to generate an indication whether any regenerative cells are to be corrected based on a comparison of the first digital representation of the analog input signal and the second digital representation of the analog input signal.

DETAILED DESCRIPTION

In many instances, it may be beneficial to convert an analog signal to a digital signal, such as for processing of the signal. Many different types of analog-to-digital converters (ADCs) have been developed to achieve the goal of converting analog signals to digitals. Each type of ADC may present different benefits, such as speed, energy consumption, resolution, or other advantages.

The ADC circuitry disclosed herein may implement pipelined-interpolating analog-to-digital converters (PIADCs) to convert an analog signal to a digital signal. The PIADCs may provide for fast conversion of the analog signal to the digital signal. The PIADCs may include a plurality of regenerative amplification (RA) cells arranged in two or more layers to form a tree of RA cells. Each layer of the tree of RA cells may interpolate on the adjacent, lower layer of RA cells within the tree. Further, the tree of RA cells are arranged to process multiple samples of the analog signal at a time in a pipelined fashion, where each layer may process a sample of the analog signal while the other layers process other samples of the analog signal.

While PIADCs may provide quick conversion of an analog signal to a digital signal, non-idealities in the RA cells, such as offset and/or imbalance, may be magnified and may cause improper and/or inaccurate outputs of the PIADCs. Therefore, it is a challenge to produce PIADCs with a large number of layers, such as more than three layers. The ADC circuitry disclosed herein may identify errors caused by non-idealities in the RA cells and perform corrections to the ADC circuitry, such as the RA cells, to avoid the improper and/or inaccurate outputs. In other words, the ADC circuitry implements transparent dithering and calibration to address the non-idealities of the PIADCs. Specifically, the ADC circuitry may implement dual PIADCs, where the ADC circuitry can compare each of the PIADCs to determine the corrections to be made to the RA cells. A transparent dither is injected into and removed from each PIADC. The ADC circuitry may further implement a rotational shuffling scheme to shuffle reference values and to expose the non-idealities to be corrected.

Legacy ADCs provide time for latches or comparators within the ADCs to settle into a saturated state before proceeding to a next part of the conversion. Ensuring the latch settles or a comparator decision settles for a period of time can ensure accuracy of the conversion and help avoid bit errors. However, allowing the latches or comparators to settle into the saturated state can add significant time to the analog-to-digital conversion. For instance, legacy ADCs may require latches within the ADCs to be saturated, such as having one or more transistors within the latches being in a saturated state for proper conversion. As time constants of the latches cause a period of time to pass prior to the latches reaching the saturated state, the legacy ADCs may have to wait for a certain amount of time to assure that the latches reach the saturated state. The RA cells implemented within the PIADCs disclosed herein may operate without the latches becoming fully saturated. In particular, the RA cells can utilize the value of the latch during the ramp up stage of the latch toward the saturated state as the output of the RA cell rather than having to wait for the latch to settle in the saturated state. In the PIADC, not having to wait for the latch to become saturated for processing may save a significant amount of time compare to the legacy ADCs, thereby allowing the ADC circuitry herein to have fast operation.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

The terms "logic 0" and "logic 1" are used throughout this disclosure. It should be understood that "logic 0" may refer to a first value (which may be a lower value) and "logic 1" may refer to a second value (which may be a higher value) as used herein. The first value may indicate a first state of a signal and the second value may indicate a second state of a signal.

FIG. 1 illustrates an example analog-to-digital converter (ADC) circuitry 100, according to various embodiments of the disclosure. The ADC circuitry 100 may receive an analog signal at an input 102 of the ADC circuitry 100 (denoted by a(k)) and generate a digital representation of the analog signal (denoted by d(k)). The digital representation of the analog signal may comprise a binary representation in some embodiments, although may be other digital protocols in other embodiments. Further, the ADC circuitry 100 may output the digital representation of the analog signal at an output 104 of the ADC circuitry 100.

The ADC circuitry 100 may include one or more pipelined-interpolation analog-to-digital converters (PIADCs), operating in parallel. The PIADCs may be arranged in parallel, where each of the PIADCs perform independent conversions of the values provided at the inputs of the PIADCs, the values provided at the inputs based on the analog input signal received at the input 102 of the ADC circuitry 100. The arrangement of the PIADCs may be referred to as a split arrangement or a dual arrangement. In some embodiments, the PIADCs may be nominally identical (i.e., electrical characteristics of each of the PIADCs within 5% of the other PIADCs). In the illustrated embodiment, the ADC circuitry 100 may include a first PIADC 106 and a second PIADC 108. The first PIADC 106 may receive a first combined signal at an input 110 of the first PIADC 106 and output a digital representation of the first combined signal at an output 112 of the first PIADC 106. The second PIADC 108 may receive a second combined signal at an input 114 of the second PIADC and output a digital representation of the second combined signal at an output 116 of the second PIADC 108. The digital representations of the first combined signal and the second combined signal may comprise binary signals in some embodiments, although it is to be understood that the digital representations may implement other digital coding protocols in other embodiments. In some embodiments, the second PIADC 108 may be replaced by a reference ADC, where the output of the reference ADC is output at the output 116.

The ADC circuitry 100 may include one or more addition circuitry to generate the combined signal for each of the PIADCs, the combined signal including an analog input signal and a dither signal. In the illustrated embodiment, the ADC circuitry 100 includes first addition circuitry 118 and second addition circuitry 120. The first addition circuitry 118 may be coupled to the input 102 of the ADC circuitry 100 and may receive an analog input signal from the input 102. The first addition circuitry 118 may further be coupled to first dither circuitry 122, where the first dither circuitry 122 produces a first dither signal and provides the first dither signal to the first addition circuitry 118. The first dither signal provided to the first addition circuitry 118 may be an analog representation of the first dither signal. The first addition circuitry 118 may sum the analog input signal and the first dither signal to produce the first combined signal. The first addition circuitry 118 may be coupled to the input 110 of the first PIADC 106 and may provide the first combined signal to the first PIADC 106. While the first dither circuitry 122 is illustrated within the ADC circuitry 100, it is to be understood that the first dither circuitry 122 may be located outside of the ADC circuitry 100 in some embodiments and may provide the first dither signal to the ADC circuitry 100. For example, when located outside of the ADC circuitry 100, the first dither circuitry 122 may be located within other circuitry of a chip that includes the ADC circuitry 100, may be located off chip (such as within another circuit element on a board that includes or is coupled to the ADC circuitry 100), or may be located in different hardware separate from the ADC circuitry 100 in a system that includes the ADC circuitry 100 in some embodiments.

The second addition circuitry 120 may be coupled to the input 102 of the ADC circuitry 100 and may receive the analog input signal from the input 102. The second addition circuitry 120 may further be coupled to second dither circuitry 124, where the second dither circuitry 124 produces a second dither signal and provides the second dither signal to the second addition circuitry 120. The second dither signal provided to the second addition circuitry 120 may be an analog representation of the second dither signal. Further, the second dither signal may be a different signal than the first dither signal, where the first dither signal and the second dither signal may have different values at a same instance. The second addition circuitry 120 may sum the analog input signal and the second dither signal to produce the second combined signal. The second addition circuitry 120 may be coupled to the input of the second PIADC 108 and may provide the second combined signal to the second PIADC 108. While the second dither circuitry 124 is illustrated within the ADC circuitry 100, it is to be understood that the second dither circuitry 124 may be located outside of the ADC circuitry 100 in some embodiments and may provide the second dither signal to the ADC circuitry 100.

The ADC circuitry 100 may further include one or more subtraction circuitry to remove a corresponding dither signal from a corresponding digital representation of the combined signal output by the corresponding PIADC to produce a digital representation of the analog input signal. In the illustrated embodiment, the ADC circuitry 100 may include first subtraction circuitry 126 and second subtraction circuitry 128. The first subtraction circuitry 126 may be coupled to the output 112 of the first PIADC 106 and may receive a digital representation of the first combined signal produced by the first PIADC 106. The first subtraction circuitry 126 may further be coupled to the first dither circuitry 122 and may receive the first dither signal from the first dither circuitry 122. The first dither signal received by the first subtraction circuitry 126 may be a digital representation of the first dither signal. The ADC circuitry 100 may further include first converter circuitry 130 coupled between the first dither circuitry 122 and the first subtraction circuitry 126, and may convert the analog representation of the first dither signal produced by the first dither circuitry 122 into the digital representation of the first dither signal utilized by the first subtraction circuitry 126. The digital representation of the first dither signal may be a binary representation in some embodiments, although may be other digital protocols in other embodiments. The first subtraction circuitry 126 may subtract the digital representation of the first dither signal from the digital representation of the first combined signal to produce a first digital representation of the analog input signal at an output 132 of the first subtraction circuitry 126. While the first converter circuitry 130 is illustrated within the ADC circuitry 100, it is to be understood that the first converter circuitry 130 may be located outside of the ADC circuitry 100 in some embodiments and may provide the digital representation of the first dither signal to the ADC circuitry 100.

The second subtraction circuitry 128 may be coupled to the output 116 of the second PIADC 108 and may receive a digital representation of the second combined signal produced by the second PIADC 108. The second subtraction circuitry 128 may further be coupled to the second dither circuitry 124 and may receive the second dither signal from the second dither circuitry 124. The second dither signal received by the second subtraction circuitry 128 may be a digital representation of the second dither signal. The ADC circuitry 100 may further include second converter circuitry 134 coupled between the second dither circuitry 124 and the second subtraction circuitry 128, and may convert the analog representation of the second dither signal produced by the second dither circuitry 124 into the digital representation of the second dither signal utilized by the second subtraction circuitry 128. The digital representation of the second dither signal may comprise a binary representation in some embodiments, although may comprise other digital protocols in other embodiments. The second subtraction circuitry 128 may subtract the digital representation of the second dither signal from the digital representation of the second combined signal to produce a second digital representation of the analog input signal at an output 136 of the second subtraction circuitry 128. While the second converter circuitry 134 is illustrated within the ADC circuitry 100, it is to be understood that the second converter circuitry 134 may be located outside of the ADC circuitry 100 in some embodiments and may provide the digital representation of the second dither signal to the ADC circuitry 100.

In the illustrated embodiment, the first dither circuitry 122 and the second dither circuitry 124 are described as producing the analog representation of the first dither signal and the analog representation of the second dither signal, respectively. Further, the first converter circuitry 130 and the second converter circuitry 134 are described as converting the analog representations of the first dither signal and the second dither signal, respectively, to digital representations. It is to be understood that in some embodiments the first dither circuitry 122 may produce a digital representation of the first dither signal and the second dither circuitry 124 may produce a digital representation of the second dither signal. In these embodiments, the first dither circuitry 122 may be coupled to the first subtraction circuitry 126 and the second dither circuitry 124 may be coupled to the second subtraction circuitry 128. The first converter circuitry 130 may be coupled between the first dither circuitry 122 and the first addition circuitry 118, and may convert the digital representation of the first dither signal to the analog representation of the first dither signal. The second converter circuitry 134 may be coupled between the second dither circuitry 124 and the second addition circuitry 120, and may convert the digital representation of the second dither signal to the analog representation of the second dither signal.

The first dither circuitry 122 may further provide the first dither signal to the first PIADC 106 and the second dither circuitry 124 may provide the second dither signal to the second PIADC 108. The first dither signal and the second dither signal may be provided to the first PIADC 106 and the second PIADC 108, respectively, as analog representations, digital representations, or some combination thereof. The first PIADC 106 and the second PIADC 108 may utilize the first dither signal and the second dither signal, respectively, in implementation of a rotational shuffling scheme, as described further in relation to FIG. 2. The first PIADC 106 and the second PIADC 108 may utilize another dither signal (e.g., a different pseudo-random signal) or a derivation of the first dither signal and the second dither signal respectively for the rotational shuffling scheme.

The ADC circuitry 100 may further include one or more comparator circuitry to compare the digital representations of the analog input signal output by the PIADCs and indicate differences between the digital representations of the analog input signal. In some embodiments, the comparator circuitry may comprise subtraction circuitry. For example, the ADC circuitry 100 may include comparator circuitry 138 in the illustrated embodiment. The comparator circuitry 138 may be coupled to the output 132 of the first subtraction circuitry 126 and the output 136 of the second subtraction circuitry 128, and may receive the first digital representation of the analog input signal from the first subtraction circuitry 126 and the second digital representation of the analog input signal from the second subtraction circuitry 128. The comparator circuitry 138 may compare the first digital representation of the analog input signal and the second digital representation of the analog input signal, and may indicate any difference between the first digital representation of the analog input signal and the second digital representation of the analog input signal. The comparator circuitry 138 may provide the difference between the first digital representation of the analog input signal and the second digital representation of the analog signal on an output 140 of the comparator circuitry 138.

The first dither signal and the second dither signal are injected and subsequently cancelled/removed. The first dither signal and the second dither signal can be seen as a transparent dither. A dither signal produced by dither circuitry can be a randomized bit/code stream. The randomized bit/code stream can be a pseudo-random sequence. The randomized bit stream can be generated by a pseudo-random number generator. The dither signal can be uncorrelated with the analog input signal. The dither signal can be a narrow-band noise signal, e.g., a narrow-band noise signal outside of the frequency band of the analog input signal. The dither signal can be a wide-band noise signal. The dither signal can have other suitable frequency responses and/or shapes of frequency responses.

The ADC circuitry 100 may further include one or more background adaptation circuitry to analyze the differences between the digital representations of the analog input signal and generates one or more indications whether corrections are to be made to the first PIADC 106 and/or the second PIADC 108 based on the differences. Ideally, the signal output by the first subtraction circuitry 126 is expected to be the same as the signal output by the second subtraction circuitry 128. In particular, once the digital representation of the first dither signal has been removed from the first digital representation of the combined signal output by the first PIADC 106 and the digital representation of the second dither signal has been removed from the second digital representation of the combined signal output by the second PIADC 108, digital representations of the analog input signal may remain at the output 132 of the first subtraction circuitry 126 and at the output 136 of the second subtraction circuitry 128. The first digital representation of the analog input signal output by the first subtraction circuitry 126 may be expected to be equal to the second digital representation of the analog input signal output by the second subtraction circuitry 128. However, if there are non-idealities in the first PIADC 106 and/or the second PIADC 108, the first digital representation of the analog input signal and the second digital representation of the analog input signal may be different values. Through the use of the transparent dither, the non-idealities of the first PIADC 106 and/or the second PIADC 108 are exposed, and the difference between the first digital representation of the analog input signal and the second digital representation of the analog input signal caused by the non-idealities can be observed. Accordingly, the background adaptation circuitry 142 can use the difference to calibrate and correct the non-idealities in the first PIADC 106 and/or the second PIADC 108 based on the difference. The indications generated by the background adaptation circuitry 142 may comprise indications of any regenerative amplification (RA) cells of the first PIADC 106 and/or the second PIADC 108 that are to be corrected based on the differences between the digital representations of the analog input signal. The indications can be represented as a vector of correction values corresponding to the RA cells of the first PIADC 106 and/or the second PIADC 108. The indications may further include an indication of the corrections to be performed based on the differences between the digital representations of the analog input signal.

In the illustrated embodiment, the ADC circuitry 100 includes background adaptation circuitry 142. The background adaptation circuitry 142 may be coupled to the output 140 of the comparator circuitry 138 and may receive the indication of any difference between the first digital representation of the analog input signal and the second digital representation of the analog input signal from the comparator circuitry 138. The background adaptation circuitry 142 may determine corrections to be made to the first PIADC 106 and/or the second PIADC 108 based on any difference between the first digital representation of the analog input signal and the second digital representation of the analog input signal. In some embodiments, the background adaptation circuitry 142 may further utilize previous differences received from the comparator circuitry 138 from comparisons of digital representations of the analog input signal from previous samples of the analog input signal converted by the first PIADC 106 and the second PIADC 108.

The background adaptation circuitry 142 may further be coupled to the first PIADC 106 via a first output 144 of the background adaptation circuitry 142 and to the second PIADC 108 via a second output 146 of the background adaptation circuitry 142. The background adaptation circuitry 142 may provide one or more indications of corrections to be performed to the first PIADC 106 and/or the second PIADC 108 via the first output 144 and the second output 146. In particular, the background adaptation circuitry 142 may provide indications of corrections to be performed by the first PIADC 106 to the first PIADC 106 via the first output 144, and may provide indications of corrections to be performed by the second PIADC 108 to the second PIADC 108 via the second output 146. The first PIADC 106 and/or the second PIADC 108 may perform corrections based on the indications received from the background adaptation circuitry 142, as described further in relation to FIG. 2 and FIG. 3.

The ADC circuitry 100 may further include addition circuitry to receive the digital representations of the analog input signal and combine the digital representations of the analog input signal to produce a single digital representation of the analog input signal at the output 104 of the ADC circuitry. In the illustrated embodiment, the ADC circuitry 100 includes addition circuitry 148. The addition circuitry 148 may be coupled to the output 132 of the first subtraction circuitry 126 and the output 136 of the second subtraction circuitry 128, and may receive the first digital representation of the analog input signal from the first subtraction circuitry 126 and the second digital representation of the analog input signal from the second subtraction circuitry 128. The addition circuitry 148 may combine the first digital representation of the analog input signal and the second digital representation of the analog input signal (such as through adding the two signals) to produce the single digital representation of the analog input signal and provide the single digital representation of the analog input signal on the output 104 of the ADC circuitry 100. While the addition circuitry 148 indicates that the first digital representation of the analog input signal and the second digital representation of the analog input signal may be added together to produce the single digital representation of the analog input signal, it should be understood that other procedures (such as averaging) may be utilized to produce the single digital representation of the analog input signal in other embodiments.

While the ADC circuitry 100 is illustrated with single lines between the components of the ADC circuitry 100, it should be understood that one or more of the lines may comprise two lines that carry a differential signal. For example, the analog input signal may comprise a differential signal and lines related to the analog input signal may comprise two lines that carry a differential signal.

Figure 2:
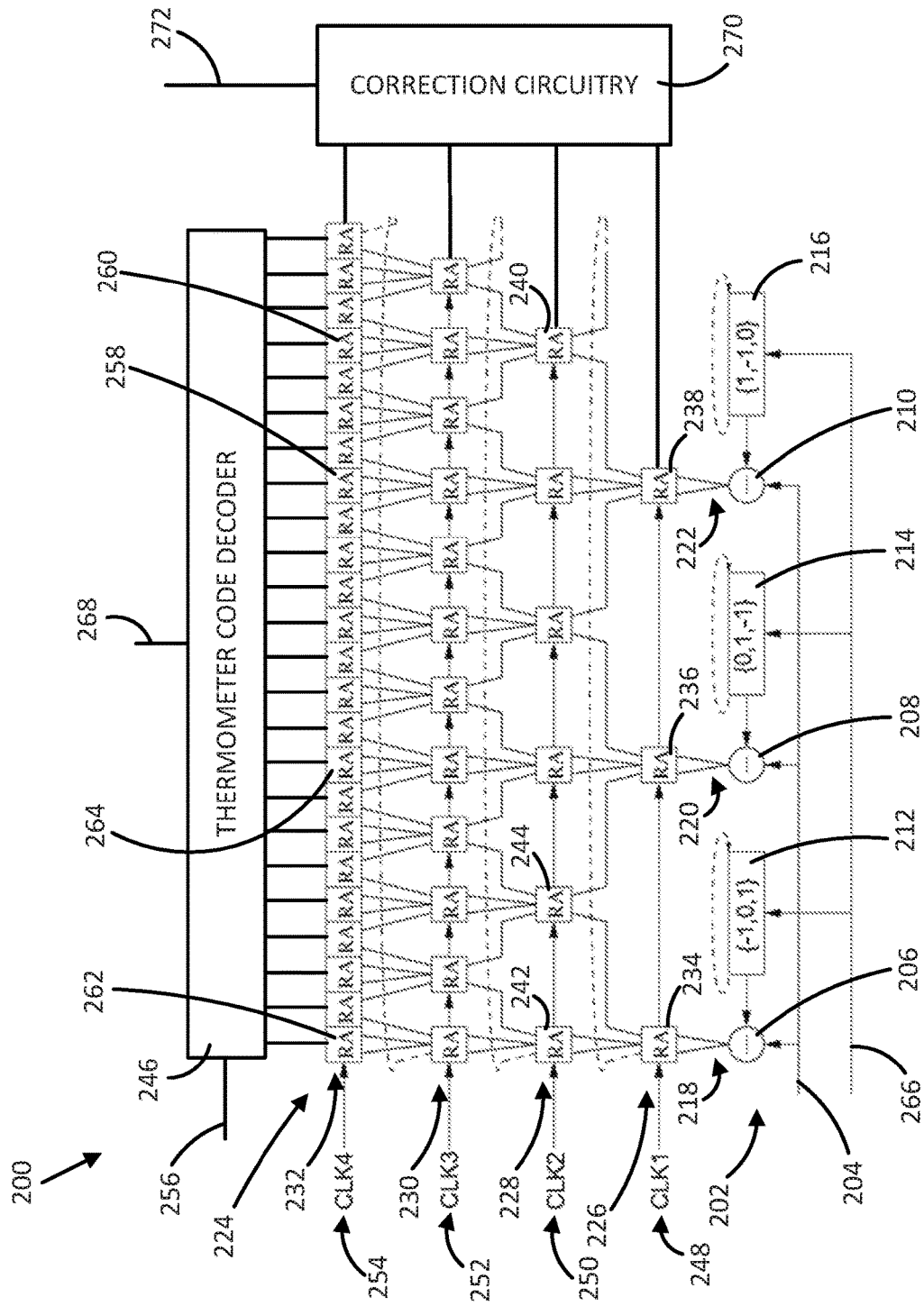
FIG. 2 illustrates an example pipelined-interpolation analog-to-digital converter, according to various embodiments of the disclosure.

FIG. 2 illustrates an example PIADC 200, according to various embodiments of the disclosure. The PIADC 200 and/or the features of the PIADC 200 may be implemented in each of the first PIADC 106 (FIG. 1) and the second PIADC 108 (FIG. 1) in some embodiments. In particular, the PIADC 200 and/or features of the PIADC 200 may be implemented as the first PIADC 106 and the second PIADC 108, where the PIADC 200 receives the corresponding analog representations of the combined signals and outputs the corresponding digital representations of the combined signals.

The PIADC 200 may include a plurality of nodes 202. Each of the plurality of nodes 202 may be coupled to an input 204 of the PIADC 200. A signal to be converted from an analog representation of the signal to a digital representation of the signal may be received via the input 204. An analog representation of a corresponding combined signal (such as the first combined signal and the second combined signal described in relation to FIG. 1) may be received via the input 204 and the PIADC 200 may produce a digital representation of the combined signal based on the received analog representation of the signal. Each of the plurality of nodes 202 may further receive a corresponding selected value, and subtract the selected value from the received analog representation of the combined signal and output the difference or an indication of a comparison between the selected value and the analog representation of the combined signal.

Figure 3:
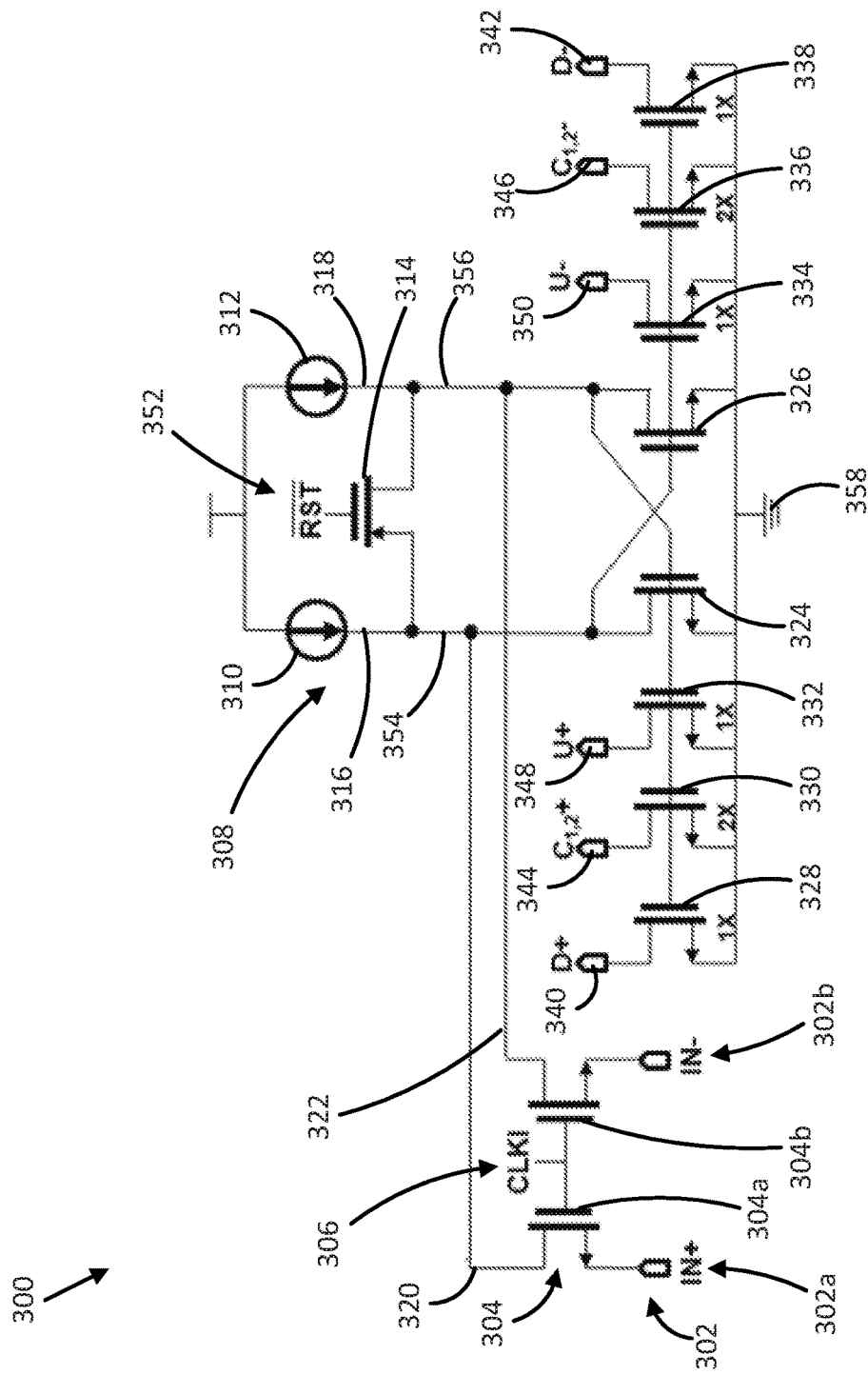
FIG. 3 illustrates an example regenerative amplifier cell, according to various embodiments of the disclosure.

In the illustrated embodiment, the plurality of nodes 202 includes a first node 206, a second node 208, and a third node 210. Each of the first node 206, the second node 208, and the third node 210 may be coupled to the input 204 of the PIADC 200 and may receive the analog representation of a combined signal on the input 204. It is envisioned by the disclosure that more nodes can be implemented, but for the sake of brevity, only three nodes are illustrated in FIG. 3.

Each of the plurality of nodes may further be coupled to reference circuitry that can generate a set of unique values, or reference values, spaced across a given range. The values within the set of unique values may include a plurality of values between a first value and a second value, where one of the first value and the second value is highest value within the plurality of values and the other of the first value and the second value is the lowest value within the plurality of values. The plurality of values may be substantially uniformly distributed or evenly spaced (i.e., uniformly distributed considering rounding of the reference circuitry) between the first value and the second value. The reference circuitry can further include switching circuitry to direct selected values from the set of unique values to the corresponding node of the plurality of nodes 202. The reference circuitry may be located within the PIADC 200, may be located remote from the PIADC 200 and provide the selected values for each of the nodes to the PIADC 200, or may have a first portion (such as circuitry to generate the set of unique values) located remote from the PIADC 200 and a second portion (such as the switching circuitry) located within the PIADC 200.

In the illustrated embodiment, the reference circuitry provides selected values to the first node 206, the second node 208, and the third node 210, as indicated by first selected value box 212, the second selected value box 214, and the third selected value box 216. The first selected value box 212 may be coupled to the first node 206 and may provide a first selected value to the first node 206. The second selected value box 214 may be coupled to the second node 208 and may provide a second selected value to the second node 208. The third selected value box 216 may be coupled to the third node 210 and may provide a third selected value to the third node 210. The first selected value, the second selected value, and the third selected value may be selected from a set of unique values based on a corresponding dither signal received via a dither signal input 266. For example, when the PIADC 200 is implemented as the first PIADC 106, the dither signal utilized for selecting the first selected value, the second selected value, and the third selected value may comprise the first dither signal generated by the first dither circuitry 122 (FIG. 1), or a derivation of the first dither signal.

In the illustrated embodiment, the set of unique values from which the first selected value, the second selected value, and the third selected value are selected includes a plurality of values between 1 and −1, where 1 is the highest value in the set of unique values and −1 is the lowest value in the set of unique values. The values within the set of unique values are uniformly distributed between 1 and −1, where a difference between each of the values is equal. In particular, the set of unique values includes −1, 0, and 1 as illustrated on the first selected value box 212, the second selected value box 214, and the third selected value box 216.

The dither signal or a derivation of the dither signal may cause different selected values to be provided to each of the first node 206, the second node 208, and the third node 210. In particular, a value or a portion of the dither signal may cause the first selected value to be provided the first node 206, the second selected value to be provided to the second node 208, and the third selected value to be provided to the third node 210, where the first selected value, the second selected value, and the third selected value are different values. For example, a portion of the bits of the dither signal or a certain range of the values of the dither signal may cause the values to be selected for each of the nodes. Adjacent nodes of the plurality of nodes may be provided with consecutive values from the set of unique values. Adjacent nodes may be defined as nodes that are coupled to a same RA cell within an adjacent layer of a tree of RA cells. For example, the first node 206 may be provided with the first selected value of −1 in an instance. The second node 208, that is adjacent to the first node 206, may be provided with the second selected value of 0 in the instance. 0 being consecutive of −1 in the illustrated embodiment. The third node 210, that is adjacent to the second node 208, may be proved with the third selected value of 1 in the instance. 1 being consecutive of 0 in the illustrated embodiment. Further, the first node 206, that is adjacent to the third node 210, received −1 as the first selected value, which is consecutive in the order of the set of unique values with the third selected value of 1.

The dither signal and the reference circuitry may implement a rotational shuffling scheme for selecting the selected values to be provided to the nodes. The rotational shuffling scheme may provide different selected values to each node as the value of the dither signal changes while each adjacent node receives a consecutive selected value to the other adjacent node.

To illustrate the rotation shuffling scheme, each of the sets of unique values illustrated in the selected value boxes are shown in positions with the value rotated. For example, the first selected value box 212 is illustrated with set of {−1, 0, 1}, where the value of −1 can be referred to as being within a first position of the set, the value of 0 can be referred to as being within a second position of the set, and the value of 1 can be referred to as being within a third position of the set. The dither signal or a portion of the dither signal may indicate a position within the set that contains a value that is to be provided to the corresponding node. In particular, a first value or range of values of the dither signal can indicate that a value in the first position is to be provided to the corresponding node, a second value or range of values of the dither signal can indicate that a value in the second position is to be provided to the corresponding node, and a third value or range of values of the dither signal can indicate that a value in the third position is to be provided to the corresponding node. For example, if the dither signal or a portion of the dither signal indicates that a value in the first position is to be provided to the corresponding node, the first selected value box 212 may provide the value of −1 (which is in the first position of the set of the first selected value box 212) to the first node 206. If the dither signal indicates that a value in the second position is to be provided to the corresponding node, the first selected value box 212 may provide the value 0 (which is in the second position of the set of the first selected value box 212) to the first node 206. If the dither signal indicates that a value in the third position is to be provided to the corresponding node, the first selected value box 212 may provide the value 1 (which is in the third position of the set of the first selected value box 212) to the first node 206.

Each selected value box coupled to a node may have set of unique values rotationally shifted by one position from the selected value boxes coupled to the adjacent nodes. For example, the second selected value box 214 may have the set of unique values shifted by one position to the left as compared to the first selected value box 212, where the value of 0 is in the first position of the second selected value box 214, the value of 1 is in the second position of the second selected value box 214, and the value of −1 in the third position of the second selected value box 214. Thereby, the ordered set of {0, 1, −1} of the second selected value box 214 may have the values shifted one position to the left from the ordered set of {−1, 0, 1} of the first selected value box 214. Further, the third selected value box 216 may have the set of unique values shifted by one position to the left as compared to the second selected value box 214, where the value of 1 is in the first position of the third selected value box 216, the value of −1 is in the second position of the third selected value box 216, and the value of 0 is in the third position of the third selected value box 216. Thereby, the ordered set {1, −1, 0} of the third selected value box 216 may have the values shifted one position to the left from the ordered set of {0, 1, −1} of the second selected value box 214. Further, the ordered set {−1, 0, 1} of the first selected value box may have the values shifted one position to the left from the ordered set of {1, −1, 0} of the third selected value box 216.

Due to the order of the sets of unique values being shifted for each of the selected value boxes, a value or a portion of the dither signal may cause different values to be selected by each of the selected value boxes. In particular, if the value of the dither signal indicates that a first position should be selected for being provided to the corresponding node, the first selected value box 212 would provide the value of −1 to the first node 206, the second selected value box 214 would provide the value of 0, and the third selected value box 216 would provide the value of 1 to third node 210 due to the value being in the first position of the sets of the corresponding selected value boxes. As can be seen, the value provided to each adjacent node is a consecutive value in the set of unique values based on the shifting. As the value of the dither signal changes to indicate that other positions should be selected, the values provided to each of the nodes will change while the values of each adjacent node may be consecutive in order within the set of unique values to each adjacent node.

Each node may subtract the selected value provided to the node from the combined signal received via the input 204. For example, when the value of the dither signal indicates that a first position should be selected, the first node 206 may subtract the value of −1 from the combined signal in the illustrated embodiment and output the result on outputs 218 of the first node 206. The second node 208 may subtract the value of 0 from the combined signal and output the result on the outputs 220 of the second node 208. The third node 210 may subtract the value of 1 from the combined signal and output the result on the outputs 222 of the third node 210. While two outputs are shown for each of the nodes in the illustrated embodiment, it should be understood that there can be one or more outputs from the nodes in other embodiments.

The PIADC 200 may further include a tree of RA cells 224 coupled to the plurality of nodes 202. The tree of RA cells 224 may include one or more layers of RA cells and the RA cells in each layer may be coupled to adjacent higher and lower layers. For example, the tree of RA cells 224 includes four layers in the illustrated embodiment, the first layer 226, the second layer 228, the third layer 230, and the fourth layer 232. The RA cells within the first layer 226 may be coupled to the RA cells within the second layer 228. The RA cells within the second layer 228 may be coupled to the RA cells within the first layer 226 and the RA cells within the third layer 230. The RA cells within the third layer 230 may be coupled to the RA cells within the second layer 228 and the RA cells within the fourth layer 232. The RA cells within the fourth layer 232 may be coupled to the RA cells within the third layer 230.

The first layer 226 of the tree of RA cells 224 may be coupled to the plurality of nodes 202. In particular, the RA cells within the first layer 226 may be coupled to the corresponding outputs of the plurality of nodes 202. For example, a first RA cell 234 within the first layer 226 is coupled to the outputs 218 of the first node 206, a second RA cell 236 within the first layer 226 is coupled to the outputs 220 of the second node 208, and a third RA cell 238 within the first layer 226 is coupled to the outputs 222 of the third node 210.

For the upper layers (i.e., layers above the first layer 226), an RA cell from the adjacent lower layer may be coupled to three different RA cells in the upper layer. For example, the first RA cell 234 of the first layer 226 may be coupled to a first RA cell 240 of the second layer 228 (as indicated by the dotted line), a second RA cell 242 of the second layer 228, and a third RA cell 244 of the second layer 228. The first RA cell 234 of the first layer 226 may provide a single output to the first RA cell 240 of the second layer 228, two outputs to the second RA cell 242 of the second layer 228, and a single output to the third RA cell 244 of the second layer 228. Further, the RA cells within the second layer 228 that receive a single output from the first RA cell 234 within the first layer may receive an output from other RA cells within the first layer. For example, the third RA cell 238 within the first layer 226 may provide a single output to the first RA cell 240 of the second layer 228 and the second RA cell 236 may provide a single output to the third RA cell 244 of the second layer 228, where the first RA cell 240 and the third RA cell 244 each receive a single output from the first RA cell 234.

The RA cells within a layer that are coupled to two different RA cells in an adjacent lower layer may perform interpolation between the two different RA cells in the adjacent lower layer. For example, the third RA cell 244 in the second layer 228 may perform interpolation between the first RA cell 234 and the second RA cell 236 in the first layer 226. The first RA cell 234 may correspond to the first selected value provided to the first node 206 and the second RA cell 236 may correspond to the second selected value provided to the second node 208. The third RA cell 244 may correspond to an interpolation value between the first selected value and the second selected value, and may output a value indicating the relationship of the combination signal to the interpolation value. For example, when the first node 206 is provided the value of −1 and the second node 208 is provided the value of 0, the third RA cell 244 may correspond to an interpolation value that is between −1 and 0. In some instances, the interpolation value may be half way between the first selected value and the second selected value. In some instances, the interpolation value may be closer to the first selected value or closer to the second selected value. Corrections made to the RA cells in the tree of RA cells 224 may cause the interpolation values for each of the RA cells to be shifted to properly produce the intended output of the tree of RA cells 224.

The outputs provided to each of the RA cells may be coupled together at the RA cell to produce a single signal for analysis by the RA cell. For example, the output of the first RA cell 234 of the first layer 226 that is coupled to the third RA cell 244 of the second layer 228 may be coupled to the output of the second RA cell 236 of the first layer 226 that is coupled to the third RA cell 244 of the second layer 228 to produce a single signal at the input of the third RA cell 244. In some embodiments, there may be additional circuit elements (such as resistors, capacitors, isolation circuitry, etc.) coupled between the RA cells providing the outputs and point where the outputs are coupled together for the higher layer RA cell. In some embodiments, each of the RA cells within the tree of RA cells 224 may be coupled to two outputs and the two outputs may be coupled to each other to produce a single signal. Further, one or more of the RA cells in the tree of RA cells 224 may be coupled to a single output while others of the RA cells are coupled to two outputs in some embodiments.

Each of the RA cells within the tree of RA cells 224 may receive a signal either produced by the corresponding node within the plurality of nodes 202 or produced by a corresponding RA cell in an adjacent, lower layer of the tree of RA cells 224 and output a high value or a low value based on the signal. For example, each of the RA cells in the tree of RA cells 224 may output either a positive value as the high value or a negative value as the low value based on the signal in some embodiments. For clarity, the output values of the RA cells may be described throughout this disclosure as being logic 0's or logic 1's, although it should be understood that the logic values correspond to a range of values outputted by the RA cells. For example, a logic 0 may correspond to negative values output by the RA cells and a logic 1 may correspond to positive values output by the RA cells.

Each of the layers of the tree of RA cells 224 may receive a corresponding clock signal that causes the RA cells within the layer to be triggered for performing the operations of the RA cells. For example, the RA cells within the first layer 226 may receive a first clock signal 248, the RA cells within the second layer 228 may receive a second clock signal 250, the RA cells within the third layer 230 may receive a third clock signal 252, and the RA cells within the fourth layer 232 may receive a fourth clock signal 254 in the illustrated embodiment.

Each of the clock signals may be offset such that each of the layers of the tree of RA cells 224 are triggered at different times. For example, each layer within the tree of RA cells 224 may be triggered at a certain time after trigger of an adjacent, lower layer within the tree of RA cells 224. In the illustrated embodiment, the second clock signal 250 may be offset from the first clock signal 248 to have the second layer 228 triggered by the second clock signal 250 at a certain time after the first layer 226 is triggered by the first clock signal 248. The offset of the clock signals can provide time for each of the RA cells to be move toward a value, as described further throughout this disclosure. In some embodiments, the triggering states of each of the clocks may overlap by approximately (within 5%) one-third with the triggering states of the clocks for the adjacent, lower layer within the tree of RA cells 224. For example, if the RA cells within the first layer 226 are triggered in response to a transition to a high state (i.e., rising edge) of the first clock signal 248, the second clock signal 250 may transition to the high state (i.e., have a rising edge) after the time that the first clock signal transitioned to the high state and at approximately (within 5%) two-thirds of the time that the first clock signal 248 is to remain in the high state prior to transitioning back to a low state.

Due to the offsets of the clock signals, multiple samples of the combined signal received by the PIADC 200 may be processed by the tree of RA cells 224 at one time. For example, the first layer 226 may be processing a second sample of the combined signal while the third layer 230 may be processing first sample of the combined signal, the first sample being sampled by the tree of RA cells prior to the second sample. The RA cells within the first layer 226 may initiate a first sampling of the combined signal in response to being triggered by the first clock signal 248 to produce a first sample of the combined signal, where the RA cells within the first layer 226 begin moving toward a value at the initiation of the first sampling. The RA cells within the second layer 228 may be triggered at a time after the triggering of the RA cells within the first layer 226 and may begin processing the values of the first sample output by the RA cells of the first layer 226. The processing of the first sample may continue through the higher layers as the clock signals trigger the layers of the tree of RA cells 224. Once the processing of the first sample has been initiated in the layers higher than the first layer 226, the first layer 226 may be reset. After being reset and prior to the first sample reaching the output of the tree of RA cells 224, the RA cells of the first layer 226 may be triggered a second time by the first clock signal 248 to begin processing of a second sample of the combined signal. By having multiple samples being processed by the tree of RA cells 224 at a same time, a speed of the conversion performed by the PIADC 200 may be faster than legacy ADCs that could only process a single sample at a time.

Outputs of a highest layer in the tree of RA cells 224 may form a thermometer code word for a sample of a combined signal received on the input 204. For example, the outputs of the fourth layer 232 in the illustrated embodiment may form a thermometer code word for a given sample of the combined signal. The thermometer code word may include a number of bit positions equal to the number of RA cells in the highest layer of the tree of RA cells 224, where each of the positions of the thermometer code word contain one of two values based on the combined signal. For example, the thermometer code word in the illustrated embodiment may have 24 bit positions, where each position may contain a logic 1 or a logic 0 based on the given sample of the combined signal.

The value of the thermometer code word may be determined based on a transition point of the thermometer code word, or more broadly, the total number of logic 1's or logic 0's in the thermometer code or some portion thereof. The transition point may comprise a position within the thermometer code word where the values within the positions of the thermometer code word transition from the first value to the second value or from the second value to the first value. In particular, the transition point in the illustrated embodiment may be a position where the values change from a logic 0 to a logic 1 or from a logic 1 to a logic 0.

As the value of the dither signal changes the transition point of the value of the thermometer code may be changed. For example, as the dither signal changes, the value of the combined signal changes and the outputs of RA cells within the tree of RA cells 224 may change causing the some of the outputs of the RA cells within the highest layer of the tree of RA cells 224 to change states from logic 0 to logic 1 or from logic 1 to logic 0. In some embodiments, a portion of the dither signal may cause the transition point to change. For example, a portion of the bit positions of the dither signal may cause the transition point to be shifted as the values of the portion of the bit positions are changed.

An optional thermometer code decoder 246 may be coupled to the output of the tree of RA cells 224, may receive the thermometer code word output by the tree of RA cells 224, and may generate a digital signal representation of the combined signal based on the thermometer code word. In particular, the thermometer code decoder 246 may identify transition points within the thermometer code word produced by the tree of RA cells 224. In instances where a thermometer code word has two bit positions that act as ends of the thermometer code, the thermometer code word may ideally include a single transition point. However, in other instances where the thermometer code word is arranged in a circular arrangement, where bit positions illustrated at ends of the thermometer code word are adjacent to each other in the thermometer code word, the thermometer code word may ideally have two transition points. The thermometer code word output by the tree of RA cells 224 may be in a circular arrangement and the thermometer code word may include more than one transition points, where one of the transition points may indicate the value of the thermometer code word and the other transition points may be an invalid transition point for determining the value of the thermometer code word.

The thermometer code decoder 246 may receive an identification signal 256 for identifying the proper transition point and determining the proper value of the thermometer code word in some embodiments. The identification signal 256 may comprise one or more of: the dither signal, an indication of the selected values provided to each of the plurality of nodes, an indication of values corresponding to each of the RA cells within highest layer (the fourth layer 232 in the illustrated embodiment), or some derivation thereof. Based on the identification signal 256, the thermometer code decoder 246 may determine a range of positions within the thermometer code word to identify the proper transition point and avoid searching in the other positions for the proper transition point in some embodiments. The other positions of the thermometer code word that searching is avoided may include the invalid transition point.

For example, the thermometer code decoder 246 may determine that the first node 206 had received a selected value of −1 from the first selected value box 212, the second node 208 had received a selected value of 0 from the second selected value box 214, and the third node 210 had received a selected value of −1 from the third selected value box 216 at the time the sample being processed by the thermometer code decoder 246 was sampled by the RA cells within the first layer 226 based on the identification signal 256. The thermometer code decoder 246 may determine the difference between the highest value of the selected values provided to the plurality of nodes 202 and the lowest value of the selected values provided to the plurality of nodes 202.

Further, the thermometer code decoder 246 may identify two of the plurality of nodes that have been provided with values having a difference equal to the difference between the highest value of the selected values and the lowest value of the selected values. For example, the difference between selected values provided to the first node 206 (where the first node 206 is provide the value of −1) and the third node 210 (where the third node 210 is provided the value of 1) in the described instance is equal to 2 and the difference between the highest value and the lowest value provided to the plurality of nodes 202 from the set of unique values is equal to 2, and the thermometer code decoder 246 may identify the first node 206 and the third node 210, accordingly.

The thermometer code decoder 246 may avoid searching the thermometer code word positions corresponding to the nodes with the difference equal to the difference between the highest value and the lowest value provided to the plurality of nodes 202. Which nodes the thermometer code word positions correspond to may be defined based on the correspondence of the RA cells within the highest layer of the tree of RA cells 224 with the plurality of nodes 202. Each of the RA cells within the tree of RA cells 224 may correspond to the one or two nodes that are coupled to the RA cell. For example, a first RA cell 258 within the fourth layer 232 may correspond to the third node 210 as the signals received by the first RA cell 258 can be traced back to the third node 210 in the illustrated embodiment. A second RA cell 260 within the fourth layer 232 may correspond to the first node 206 and the third node 210 as the signals received by the second RA cell 260 can be traced back to the first node 206 and the third node 210 (in particular, the first RA cell 240 of the second layer 228 coupled to the second RA cell 260 is coupled to the first node 206 and the third node 210 through the first RA cell 234 in the first layer). The thermometer code decoder 246 may avoid searching the positions of the thermometer corresponding to both the first node 206 and the third node 210 for the transition point for determining the value of the thermometer code word.

The thermometer code decoder 246 may further utilize the identification signal 256 to determine the value of the thermometer code word based on the position of the transition point within the thermometer code word. For example, the thermometer code decoder 246 may determine the selected values provided to each of the nodes within the plurality of nodes 202 and the RA cells within the highest layers that correspond to each of the plurality of cells. For example, the thermometer code decoder 246 may determine that the first node 206 is provided with the selected value of −1, the second node 208 is provided with the selected value of 0, and the third node 210 is provided with the selected value of 1 in an instance. The thermometer code decoder 246 may determine that the first RA cell 258 of the fourth layer 232 corresponds to the third node 210, a second RA cell 262 of the fourth layer 232 corresponds to the first node 206, and a third RA cell 264 of the fourth layer 232 corresponds to the second node 208. Based on the correspondences between each of the RA cells and the nodes, the thermometer code decoder 246 can determine that the RA cells correspond to the values provided to the nodes and, therefore, the positions of the thermometer code word produced by the RA cells may correspond to the values. For example, the second RA cell 262 and the corresponding position of the thermometer code word may correspond to the value of −1 that was provided to the first node 206, the third RA cell 264 and the corresponding position of the thermometer code word may correspond to the value of 0 that was provided to the second node 208, and the first RA cell 258 and the corresponding position of the thermometer code word may correspond to the value of −1 that was provided to the third node 210. The thermometer code decoder 246 may determine the value of the thermometer code word based on the position of the transition point relative to the values corresponding to the position. For example, if the transition point is determined to be at a position of the thermometer code word corresponding to the second RA cell 262, the value of the thermometer code word can be determined to be −1 based on the second RA cell 262 corresponding to the first node 206 that was provided with −1. As the dither signal provided on the dither signal input 266 changes and, accordingly, the values provided to each of the nodes of the plurality of nodes are rotated, the values corresponding to the RA cells within the fourth layer 232 may change or shift depending on the rotation of the values. Additionally, the dither signal added to produce the combined signal may also change or shift the values corresponding to the RA cells within the fourth layer 232 by an amount corresponding to the additive dither. The thermometer code decoder 246 may output the value of the thermometer code word on an output 268 of the PIADC 200.

In other embodiments, the value of the thermometer code word may be determined based on a number of logic 1's and/or a number of logic 0's within a portion of the positions of the signals. For example, the thermometer code decoder 246 may the nodes that receive values with a difference equal to the difference between the highest value of the selected values provided to the plurality of nodes 202 and the lowest value of the selected values provided to the plurality of nodes 202 based on the identification signal. Further, the thermometer code decoder 246 may identify a portion of the thermometer code word that corresponds to both the nodes that receive the values with the difference equal to the difference between the highest value of the selected values provided to the plurality of nodes 202 and the lowest value of the selected values provided to the plurality of nodes 202. The thermometer code decoder 246 may count the number of logic 1's and/or logic 0's within the thermometer code word while avoiding counting the logic 1's and/or logic 0's of the identified portion of the thermometer code word that corresponds to the two identified nodes. Based on the number of logic 1's and/or logic 0's, the thermometer code decoder 246 may determine the value of the thermometer code word.

For example, the thermometer code decoder 246 may determine that the first node 206 had received a selected value of −1 from the first selected value box 212, the second node 208 had received a selected value of 0 from the second selected value box 214, and the third node 210 had received a selected value of −1 from the third selected value box 216 at the time the sample being processed by the thermometer code decoder 246 was sampled by the RA cells within the first layer 226 based on the identification signal 256. The thermometer code decoder 246 may determine the difference between the highest value of the selected values provided to the plurality of nodes 202 and the lowest value of the selected values provided to the plurality of nodes 202, which is 1 and −1 in this instance respectively. The thermometer code decoder 246 may count the number of logic 1's within the thermometer code word while avoiding the positions of the thermometer code word corresponding to both the first node 206, that receives the selected value of −1, and the third node 210, that receives the selected value of 1. The thermometer code decoder 246 may determine the value of the thermometer code word between −1 and 1 based on the number of logic 1's that were counted.

The PIADC 200 may further include correction circuitry 270. The correction circuitry 270 may be coupled to a portion of the RA cells within the tree of RA cells 224. In particular, the correction circuitry 270 may be coupled to the RA cells within one or more of the layers of the tree of RA cells 224. For example, the correction circuitry 270 is coupled to the RA cells within first layer 226, the second layer 228, the third layer 230, and the fourth layer 232 in the illustrated embodiment. In embodiments where the correction circuitry 270 is coupled to less than all the layers of the tree of RA cells 224, the correction may take into the corrections that should be made in layers to which the correction circuitry 270 is not coupled and may provide weight to the correction for the layers to which the correction circuitry 270 is not coupled. The correction circuitry 270 may be coupled to background adaptation circuitry (such as the background adaptation circuitry 142 (FIG. 1)) and may receive an indication, from the background adaptation circuitry, whether any of the RA cells within the PIADC 200 are to be corrected via a correction circuitry input 272. The indication may include a vector of correction values corresponding to the RA cells. The correction circuitry 270 may determine, based on the indication whether any of the RA cells are to be corrected which RA cells within the tree of RA cells 224 are to be corrected and may transmit correction signals to the RA cells to cause the RA cells to be corrected. The correction of the RA cells can allow the tree of RA cells 224 to adapt for any non-idealities within the RA cells such that the output of the tree of the RA cells 224 performs as intended. Without the adaptation, errors could occur at the output of the tree of RA cells 224, where the non-idealities of the RA cells in the lower layers can be amplified by the higher layers to create larger errors. The more layers within the tree of RA cells, the greater the chance that the amount of error will exceed an acceptable amount, rendering the PIADC ineffective.

While the PIADC 200 is illustrated with particular components, it should be understood that additional components may be included in the PIADC 200 in some embodiments, and/or some of the illustrated components may be omitted from the PIADC 200 in other embodiments. For example, the correction circuitry 270 may be omitted from the PIADC 200 in some embodiments. In some of these embodiments, the indication whether any of the RA cells are to be corrected may be provided directly to the RA cells within the tree of RA cells 224 and cause the cells to perform the corrections.

While the PIADC 200 is illustrated with single lines between the components of the PIADC 200, it should be understood that one or more of the lines may comprise two lines that carry a differential signal. For example, the combined signal may comprise a differential signal and lines related to the combined signal may comprise two lines that carry a differential signal.

FIG. 3 illustrates an example RA cell 300, according to various embodiments of the disclosure. The RA cell 300 is an example of an RA cell that may be implemented by each of the RA cells within the tree of RA cells 224 (FIG. 2). A function of the RA cell 300 may be to receive a differential input and generate one or more amplified differential output based on the differential input. For example, the RA cell 300 may compare a positive component of the differential input and a negative component of the differential input and output a value based on the results of the comparison. In some instances, the RA cell 300 may have an offset where the offset can imbalance the comparison toward the positive component or the negative component.

The RA cell 300 may include a differential input 302 that is to receive a differential signal. For the RA cells within the tree of RA cells 224, the input of the RA cells may comprise the differential input 302. The differential input 302 may include a positive line 302a and a negative line 302b. The positive line 302a may receive a positive component of the differential signal and the negative line 302b may receive a negative component of the differential signal.

The RA cell 300 may further comprise switch circuitry 304. The switch circuitry 304 may be coupled to the differential input 302. For example, the switch circuitry 304 may comprise a first transistor 304a coupled to the positive line 302a of the differential input 302 and a second transistor 304b coupled to the negative line 302b of differential input 302. The switch circuitry 304 may propagate the differential signal (i.e., be in a closed state) or disconnect the differential signal (i.e., be in an open state) based on the state of the switch circuitry 304. In particular, a clock signal 306 may control a state of the switch circuitry 304. In the illustrated embodiment, the clock signal 306 may be provided to gates of the first transistor 304a and the second transistor 304b and can control whether the first transistor 304a and the second transistor 304b are opened or closed.

The RA cell 300 may further comprise a latch 308. The latch 308 may be coupled to the switch circuitry 304 and may receive the differential signal when propagated by the switch circuitry 304. The latch 308 may implement positive feedback and negative feedback. In the illustrated embodiment, the latch 308 may include a first current source 310, a second current source 312, and a reset switch 314. The reset switch 314 may be coupled between an output 316 of the first current source 310 and an output 318 of the second current source 312. The reset switch 314 may be controlled by a reset signal 352, where the reset switch 314 can allow current to flow between the output 316 and the output 318 (or shorts the output 316 and output 318 together to reset the latch) or prevent current flow between the output 316 and the output 318 based on the value of the reset signal. The output 316 of the first current source 310 may further be coupled to a positive output 320 of the switch circuitry 304, where the positive output 320 may carry the positive component of the differential signal from the positive line 302a when the switch circuitry 304 propagates the differential signal. The output 318 of the second current source 312 may be coupled to a negative output 322 of the switch circuitry 304, where the negative output 322 may carry the negative component of the differential signal from the negative line 302b when the switch circuitry 304 propagates the differential signal.

The latch 308 may further include a first transistor 324 and a second transistor 326. A source of the first transistor 324 may be coupled to the output 316 of the first current source 310 and a gate of the first transistor 324 may be coupled to the output 318 of the second current source 312. A source of the second transistor 326 may be coupled to the output 318 of the second current source 312 and a gate of the second transistor 326 may be coupled to the output 316 of the first current source 310. The drains of the first transistor 324 and the second transistor 326 may be coupled to ground 358. The first transistor 324 may correspond to a positive component of a differential signal output by the RA cell 300 and the second transistor 326 may correspond to a negative component of the differential signal output by the RA cell 300. A positive node 354 of the latch 308 may be formed at the source of the first transistor 324 and a negative node 356 of the latch 308 may be formed at the source of the second transistor 326, where the positive node 354 corresponds to the positive component of the differential signal and the negative node 356 corresponds to the negative component of the differential signal.

The RA cell 300 may further include one or more current mirrors coupled to the first transistor 324 and the second transistor 326. The current mirrors may mirror and optionally scale the current propagating through the first transistor 324 and the second transistor 326. In the illustrated embodiment, the current mirrors includes a first transistor 328, a second transistor 330, and a third transistor 332 that mirror the current propagating through the first transistor 324. Gates of the first transistor 324, the first transistor 328, the second transistor 330, and the third transistor 332 are tied together and the drains of the first transistor 324, the first transistor 328, the second transistor 330, and the third transistor 332 may be coupled to ground 358 causing the potential difference between the gates and drains of each of the transistors to be equal. The potential difference between the gates and drains may cause the first transistor 328, the second transistor 330, and the third transistor 332 to mirror the current of the first transistor 324. The current mirrors further includes a fourth transistor 334, a fifth transistor 336, and a sixth transistor 338 that mirror the current propagating through the second transistor 326. Gates of the second transistor 326, the fourth transistor 334, the fifth transistor 336, and the sixth transistor 338 are tied together and the drains of the second transistor 326, the fourth transistor 334, the fifth transistor 336, and the sixth transistor 338 may be coupled to ground 358 causing the potential difference between the gates and drains of each of the transistors to be equal. The potential difference between the gates and drains may cause the fourth transistor 334, the fifth transistor 336, and the sixth transistor 338 to mirror the current of the second transistor 326.

The transistors of the current mirrors may be paired, where one of the transistors of the pair produces a positive component of a differential signal output by a first output the RA cell 300 and the other transistor of the pair produces a negative component of the differential signal. In the illustrated embodiment, the first transistor 328 may be paired with the sixth transistor 338, where the first transistor 328 produces a positive component of a differential signal output on a first output of the RA cell 300 and the sixth transistor 338 produces a negative component of the differential signal. Further, the second transistor 330 may be paired with the fifth transistor 336, where the second transistor 330 produces a positive component of a differential signal output on a second output of the RA cell 300 and the fifth transistor 336 produces a negative component of the differential signal. The third transistor 332 may be paired with the fourth transistor 334, where the third transistor 332 produces a positive component of a differential signal output on a third output of the RA cell 300 and the fourth transistor produces a negative component of the differential signal.

The RA cell 300 may include one or more outputs coupled to the current mirrors. The RA cell 300 may include three outputs in the illustrated embodiment. Each output may be coupled to a corresponding pair of the transistors within the current mirror that mirror the currents of the first transistor 324 and the second transistor. In the illustrated embodiment, a first output may include a positive line 340 coupled to a source of the first transistor 328 and a negative line 342 coupled to a source of the sixth transistor 338, where the positive line 340 and the negative line 342 form a differential output. A second output may include a positive line 344 coupled to a source of the second transistor 330 and a negative line 346 coupled to a source of the fifth transistor 336, where the positive line 344 and the negative line 346 form a differential output. A third output may include a positive line 348 coupled to a source of the third transistor 332 and a negative line 350 coupled to a source of the fourth transistor 334, where the positive line 348 and the negative line 350 form a differential output. In some embodiments, the outputs shown may be split into separate outputs. For example, the second output may be split into two outputs where the second transistor 330 and the fifth transistor 336 may be split into four transistors with each of the transistors coupled to one of the positive or negative components of the two outputs. Further, each of the outputs may output a scaled value based on the value of the latch. For example, the second output may output twice the current of the first output and the third output based on the different characteristics of the second transistor 330 and the fifth transistor 336 as compared to the other transistors in the current mirror in some embodiments.

The RA cell 300 may operate in a variety of states based on the value of the clock signal 306 and the value of the reset signal 352. In some embodiments, the reset signal 352 may comprise the clock signal 306, where the switch circuitry 304 may be closed based on the clock signal 306 being in a first state (such as a logic 1 state) and the reset switch 314 may be closed based on the clock signal 306 being in a second state (such as a logic 0 state). In other embodiments, the clock signal 306 and reset signal 352 may be separate signals that are timed to provide the variety of states described herein.

In a first state, the switch circuitry 304 may be open based on the value of the clock signal 306 and the reset switch 314 may be closed based on the value of the reset signal 352. In this state, the switch circuitry 304 may separate the differential signal from the positive output 320 and the negative output 322. Further, the reset switch 314 may allow current to flow between the output 316 of the first current source 310 and the output 318 of the second current source 312. The reset switch 314 may provide negative feedback of the latch 308, which may control the operation of the latch 308 in this state. Due to the current flowing between the first current source 310 and the second current source 312 and the differential signal being disconnected, current will flow to the first transistor 324 and the second transistor 326, and the first transistor 324 and the second transistor 326 can operate in a threshold operation with a threshold voltage across both the first transistor 324 and the second transistor 326. With the first transistor 324 and the second transistor 326 in the threshold operation, the positive node 354 and the negative node 356 may be driven to a same voltage, where there may be no difference in the voltage levels the signals at the positive node 354 and the negative node 356. Each of the transistors within the pair of transistors of the current mirrors may propagate a same amount of current and have the positive lines and negative lines having the same voltage, thereby producing a differential signal with a value of 0. For example, the first transistor 328 and the sixth transistor 338 within the current mirrors may cause the positive line 340 and the negative line 342 to have a same voltage in this state, thereby causing the differential signal of the first output of the RA cell 300 to be a differential signal with a value of 0.

In a second state, the switch circuitry 304 may be closed based on the value of the clock signal 306 and the reset switch 314 may be open based on the value of the reset signal 352. In this state, the switch circuitry 304 may allow the differential signal received at the positive line 302a and the negative line 302b to be propagated to the positive node 354 and the negative node 356. Further, the reset switch 314 may not propagate current between the output 316 of the first current source 310 and the output 318 of the second current source 312. Assuming the differential signal received at the differential input 302 has different values for the positive component and the negative component, the differential signal can cause the positive node 354 and the negative node 356 to move toward a value according to the value of the differential signal. In particular, the differential signal can cause one of the positive node 354 and the negative node 356 to be driven high and the other of the positive node 354 and the negative node 356 to be driven low. The first current source 310 and the second current source 312 may provide positive feedback in this state, which may control the operation of the latch 308 in this state. In particular, the first current source 310 and the second current source 312 provide current to the positive node 354 and the negative node 356 and amplify differences in the voltages of the positive node 354 and the negative node 356 caused by the differential signal received by the differential input 302. Further, the current provided by the first current source 310 and the second current source 312 may cause the positive node 354 or the negative node 356 that is being driven low to turn off the corresponding first transistor 324 or the second transistor 326 to which node is coupled to the gate. The transistors within the current mirror may mirror the current flow across the first transistor 324 and the second transistor 326, respectively, causing the outputs of the current mirror to be driven to voltages based on the current flow across the first transistor 324 and the second transistor 326. In some embodiments, the outputs of the current mirror may have a gain over the differential signal received at the differential input 302, such as having a gain of twice the differential signal. Accordingly, when the RA cell 300 is implemented as the RA cells within the tree of RA cells 224, each layer of the tree of RA cells may provide a gain to the differential signal being processed.

The latch 308 may have a time constant that limits a rate of change of the values at the positive node 354 and the negative node 356. The time constant may be based on capacitance of the positive node 354 and/or the negative node 356, the transconductance of the first transistor 324 and/or the second transistor 326, capacitance and/or transconductance of other components within the latch 308, or some combination thereof. The time constant can define a rate of change of the voltages at the positive node 354 and the negative node 356 based on the capacitance, the transconductance, the current being provided to the node, an amount of voltage difference between the positive component and the negative component of the differential signal being input to the RA cell 300, or some combination thereof. In some embodiments, the RA cell 300 can be designed with a large transconductance and a small capacitance to allow a high rate of change.

For PIADCs (such as the PIADC 200 (FIG. 2)) that implement RA cells such as the RA cell 300, the PIADC may take in consideration of the time constant of the latch 308 in processing of the combined signal to speed up the processing as compared to legacy ADCs. For example, legacy ADCs may wait for the latch to settle to a stable state, such as when the first transistor 324 and/or second transistor 326 are saturated. The time for the first transistor 324 and the second transistor 326 to become saturated may be referred to as a regeneration time of the latch. Accordingly, these legacy ADCs have to have enough time between the start of the processing and the output of the latch being utilized for the first transistor 324 and/or the second transistor 326 to become saturated. In contrast, the PIADCs disclosed herein may utilize the output prior to the first transistor 324 and/or the second transistor 326 being saturated, which can speed up the conversion being performed by the PIADC. The operation of the PIADC does not require that the first transistor 324 and/or the second transistor 326 to fully reach a saturation state to operate properly. Referring to the PIADC 200, a higher, adjacent layer of the tree of RA cells 224 (FIG. 2) prior to the RA cells in a layer having the first transistor and/or the second transistor of the latches being saturated. For example, the RA cells within the second layer 228 may be triggered by the second clock signal 250 to begin processing the signals output by the RA cells within the first layer 226 prior to the first transistor and the second transistors of the latches being saturated. To facilitate the higher, adjacent layers being triggered prior to the saturation of the transistors, the clock signals of adjacent layers may be timed with the offset between triggering the RA cells being less than the regeneration time of the latches within the RA cells of the tree of RA cells 224.

The RA cell 300 may transition between the first state and the second state to process samples of a differential signal provided to the differential input 302. For example, the RA cell 300 may initiate in the first state with the reset switch 314 closed and the switch circuitry 304 open to drive the positive node 354 and the negative node 356 to the same value, thereby causing the outputs of the RA cell 300 to produce a differential signal of approximately (within 5%) 0 volts. The RA cell 300 may then transition to the second state with the switch circuitry 304 closed and the reset switch 314 opened to process a sample of the differential signal at the differential input 302. When in the second state, the positive node 354 and the negative node 356 may move toward a value, with one of the positive node 354 or the negative node 356 being driven toward a high value and the other of the positive node 354 or the negative node 356 being driven toward a low value. The outputs of the RA cell 300 may further move toward in accordance with the movement of the positive node 354 and the negative node 356 toward a value, with one of a positive line or a negative line of each of the outputs being driven to a high value and the other of the positive line or the negative line being driven low in accordance with the movement of the positive node 354 and the negative node 356 toward a value. The RA cell 300 may then return to the first state to reset the positive node and the negative node to the same value prior to transitioning to the second state to process a second sample of the differential signal. In some of the embodiments, the RA cell 300 may return to the first state prior to the first transistor 324 and the second transistor 326 becoming saturated. Further, additional states of the RA cell 300 may exist in some embodiments where both the switch circuitry 304 and the reset switch 314 are closed, or both the switch circuitry 304 and the reset switch 314 are open.

In some embodiments, corrections may be made to the RA cell 300 to achieve an intended operation. For example, the RA cell 300 may have an imbalance between the positive node 354 and the negative node 356, an time constant value, and/or other non-idealities of the components of the RA cell 300 that can cause the outputs of the RA cell 300 (or the outputs of a system in which the RA cell 300 is implemented, such as the PIADC 200) to be different than what is expected based on the differential input signal received at the differential input 302. The RA cell 300 may receive an indication that the RA cell 300 is to be corrected (such as an indication from the correction circuitry 270 (FIG. 2) or the background adaptation circuitry 142 (FIG. 1)) and implement a correction based on the indication. In some embodiments, the correction can comprise unbalancing the output currents of the first current source 310 and/or the second current source 312 to output different currents, increasing or reducing the current output by the first current source 310 and/or the second current source 312, tuning operating characteristics of the first transistor 324 and/or the second transistor 326, or some combination thereof. Further, the RA cell 300 may include variable capacitance elements (such as variable capacitors) coupled to, e.g., the positive node 354 and/or the negative node 356 in some embodiments, where the correction can comprise changing the capacitance of the variable capacitance elements to change the value of the time constant of the RA cell 300.

Corrections to the RA cell 300 may ensure proper operation of systems in which the RA cell 300 may be implemented, such as the PIADC 200. For example, the pipeline of the tree of RA cells 224 formed by the multiple layers of the tree of RA cells 224 may amplify any non-idealities presented by the RA cell 300 as signals are propagated through the tree of RA cells 224. The amplification of the non-idealities can result in improper outputs of the PIADC 200 and/or failure of the PIADC 200. Performing the corrections to the RA cell 300 within the PIADC 200 may improve accuracy, prevent or reduce the risk of improper outputs, and/or failure of the PIADC 200.

Figure 4:
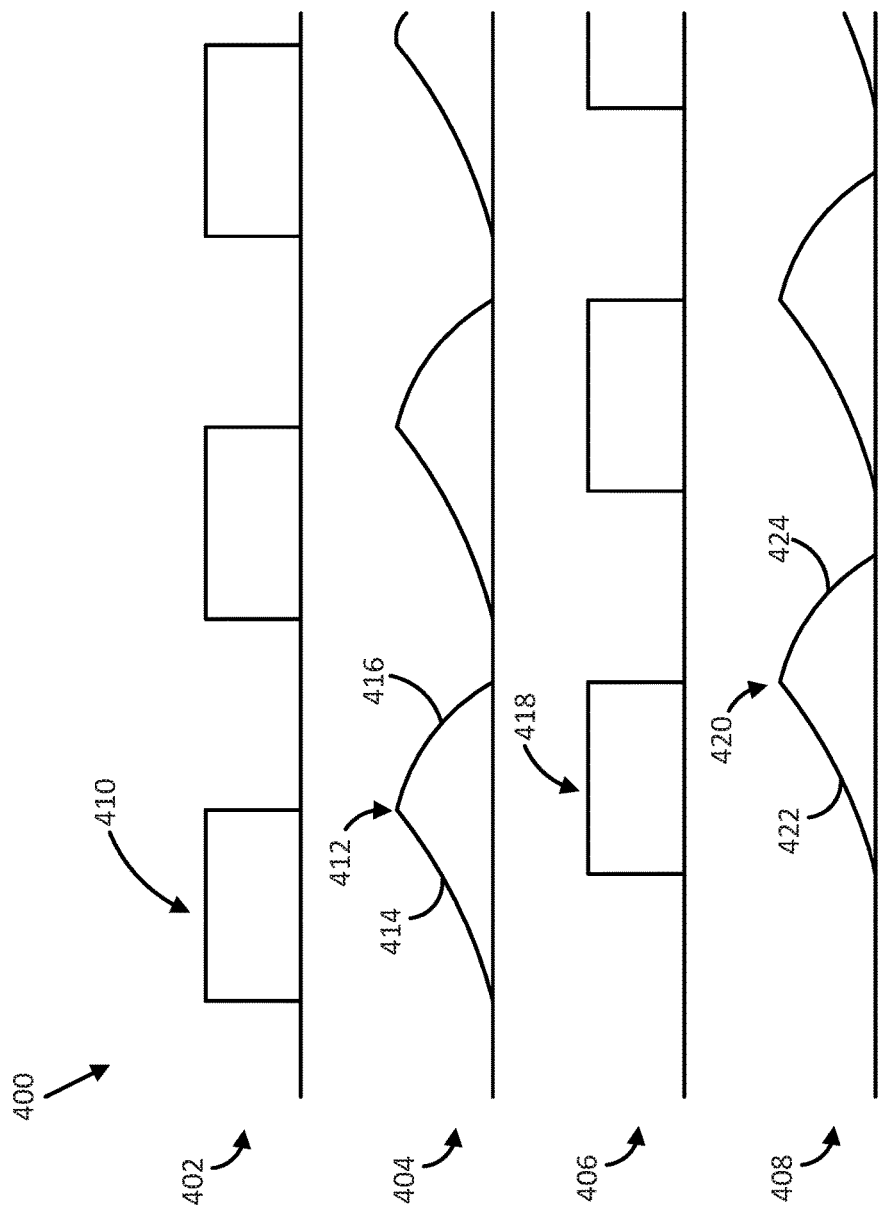
FIG. 4 illustrates example timing diagrams, according to various embodiments of the disclosure.

FIG. 4 illustrates example timing diagrams 400, according to various embodiments of the disclosure. In particular, the timing diagrams 400 illustrates clock signals and corresponding outputs for two different layers of RA cells within a PIADC, such as the PIADC 200 (FIG. 2). For example, the timing diagrams 400 include a first clock timing diagram 402 showing a first clock signal (such as the first clock signal 248 (FIG. 2)) of a first layer (such as the first layer 226 (FIG. 2)) and a first output timing diagram 404 showing an output signal of a first RA cell (such as the first RA cell 234 (FIG. 2)) of the first layer. Further, the timing diagrams include a second clock timing diagram 406 showing a second clock signal (such as the second clock signal 250 (FIG. 2)) of a second layer (such as the second layer 225 (FIG. 2)) and a second output timing diagram 408 showing an output signal of a second RA cell (such as the second RA cell 242 (FIG. 2)) of the second layer. In the illustrated embodiment, the clock signals may operate as both a clock signal (such as the clock signal 306 (FIG. 3)) and a reset signal (such as the reset signal 352 (FIG. 3)) of an RA cell (such as the RA cell 300 (FIG. 3)), where the high value of the clock signals may cause a latch (such as the latch 308 (FIG. 3)) to begin moving toward a value and the low value of the clock signals cause the RA cell be in a reset state.

The first clock timing diagram 402 shows a first step 410, where the value of the first clock signal goes high during the first step 410. The first clock signal going high may cause a switch circuitry (such as the switch circuitry 304 (FIG. 3)) of the first RA cell to be closed and a reset switch (such as the reset switch 314 (FIG. 3)) of the first RA cell to be open. The switch circuitry being closed and the reset switch being opened may cause a first sample of a differential signal at the input (such as the differential input 302 (FIG. 3)) of the first RA cell to be captured. The output of the first RA cell may begin to move toward a value based on the differential signal sampled at the input of the first RA cell. The first output timing diagram 404 shows a first output 412 that is produced in response to the first step 410, e.g., when the latch is moving to a value. The first output 412 may include a ramp up period 414 that occurs while the clock signal is maintained at the high value during the first step 410, where the rate of increase of the output signal during the ramp up period 414 may be dependent on a time constant of the latch of the first RA cell.

At the end of the first step 410, where the first clock signal goes low, the first RA cell may transition to a reset state. In the reset state, the switch circuitry of the first RA cell may be opened and the reset switch may be closed based on the first clock signal going low. In response to the switch circuitry being opened and the reset switch being closed, the nodes of the latch of the first RA cell may be driven to a same value and the output of the first RA cell to approach 0. The first output 412 includes a ramp down period 416 that can initiate in response to the first clock signal going low. During the ramp down period 416, the output can begin approaching 0 from the value of the output signal is at when the first clock signal transitions to the low value. A rate that the output signal decreases during the ramp down period 416 may be dependent on the time constant of the latch of the first RA cell.

The second clock timing diagram 406 shows a second step 418, where the value of the second clock signal goes high during the second step 418. The second clock signal may go high during the second step 418 while the first clock signal is still high during the first step 410. In particular, the timing of the first clock signal being high during the first step 410 may overlap with the second clock signal being high during the second step 418. In some embodiments, the first step 410 and the second step 418 may overlap by approximately (within 5%) one-third of a duration of each of the steps. Further, the second clock may be high during the second step 418 while the output of the first RA cell is outputting a value based on movement of the latch to a certain value as illustrated by the first output 412.

The second clock signal going high may cause a switch circuitry of the second RA cell to be closed and a reset switch of the second RA cell to be open. The second RA cell may be coupled to the output of the first RA cell and may receive the output signal of the first RA cell illustrated by the first output timing diagram 404. The switch circuitry being closed and the reset switch being opened may cause the output signal of the first RA cell corresponding to the first sample to be captured by the second RA cell. The output of the second RA cell may begin to move based on the output signal received from the first RA cell. The second output timing diagram 408 shows a second output 420 that is produced in response to the second step 418. The second output 420 may include a ramp up period 422 that occurs while the clock signal is maintained at the high value during the second step 418, where the rate of increase of the output signal during the ramp up period 422 may be dependent on a time constant of the latch of the first RA cell.

At the end of the second step 418, where the second clock signal goes low, the second RA cell may transition to a reset state. In the reset state, the switch circuitry of the second RA cell may be opened and the reset switch may be closed based on the second clock signal going low. In response to the switch circuitry being opened and the reset switch being closed, the nodes of the latch of the second RA cell may be driven to a same value and the output of the second RA cell to approach 0. The second output 420 includes a ramp down period 424 that can initiate in response to the second clock signal going low. During the ramp down period 424, the output can begin approaching 0 from the value of the output signal is at when the second clock signal transitions to the low value. A rate that the output signal decreases during the ramp down period 424 may be dependent on the time constant of the latch of the second RA cell.

Figure 5:
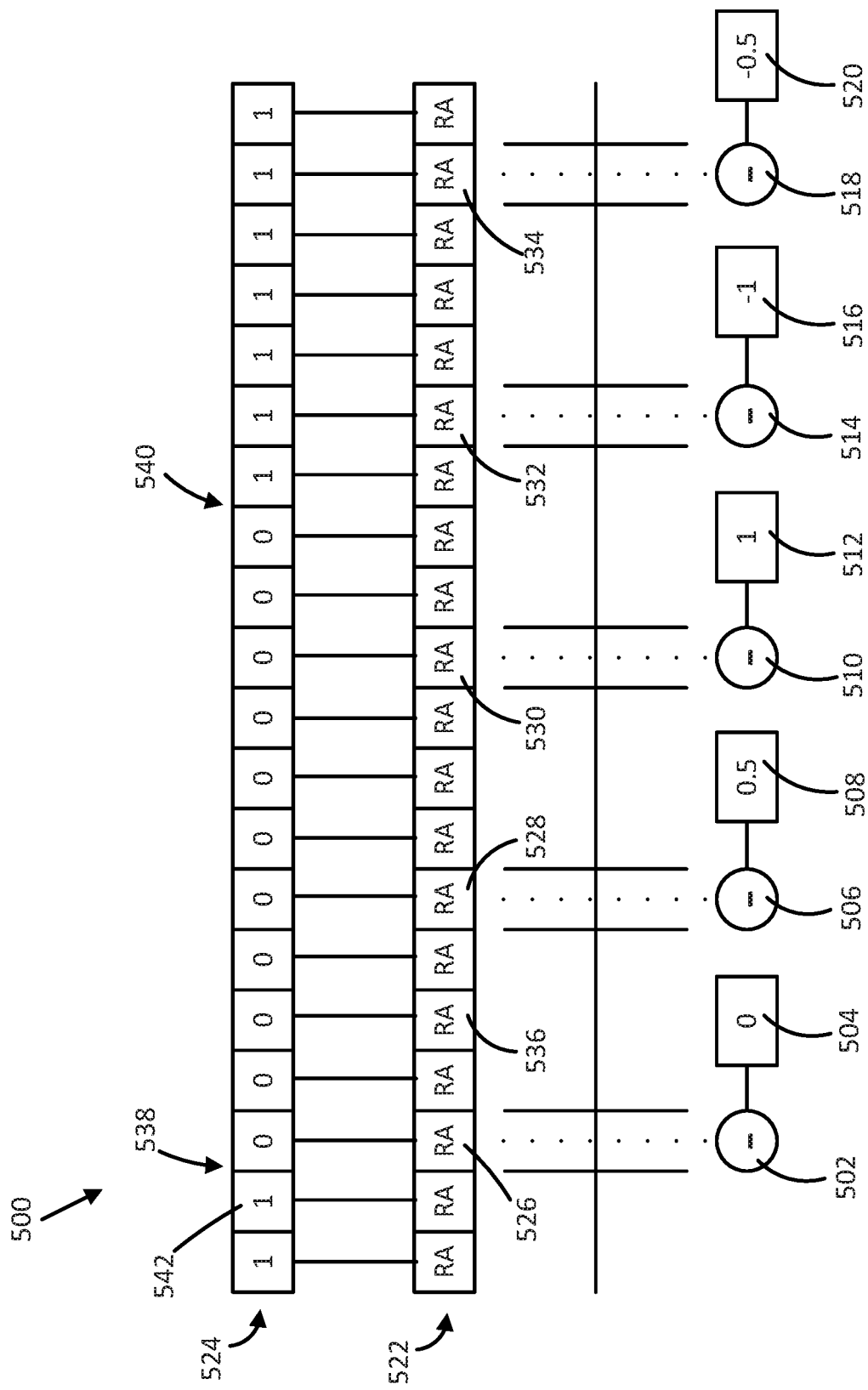
FIG. 5 illustrates an example pipelined-interpolation analog-to-digital converter instance, according to various embodiments of the disclosure.

FIG. 5 illustrates an example PIADC instance 500, according to various embodiments of the disclosure. The PIADC instance 500 illustrates a plurality of nodes (such as the plurality of nodes 202 (FIG. 2)) with selected value boxes (such as the selected value boxes of FIG. 2) indicating the values provided to the plurality of nodes. The values provided to the plurality of nodes may be selected from a set of unique values. In particular, the PIADC instance 500 illustrates a first node 502 with a first selected value box 504 indicating that the first node 502 was provided a value of 0, a second node 506 with a second selected value box 508 indicating that the second node 506 was provided a value of 0.5, a third node 510 with a third selected value box 512 indicating that the third node 510 was provided a value of 1, a fourth node 514 with a fourth selected value box 516 indicating that the fourth node 514 was provided a value of −1, and a fifth node 518 with a fifth selected value box 520 indicating that the fifth node 518 was provided a value of −0.5.

The PIADC instance 500 further illustrates a layer of RA cells 522, where the layer of RA cells 522 may be a highest layer of a tree of RA cells (such as the tree of RA cells 224 (FIG. 2)). The PIADC instance 500 further illustrates a thermometer code word 524 that may be produced by the layer of RA cells 522. The thermometer code word 524 may be formed by the values output by each of the RA cells within the layer of RA cells 522.

Each of the RA cells within the layer of RA cells 522 may correspond to one or more of the nodes. In particular, each of the RA cells may correspond to the nodes that provide inputs to the RA cell. The dotted lines shown in the PIADC instance 500 between RA cells and the nodes indicate where the RA cells receive inputs from a single node and, therefore, correspond to a single node. In particular, a first RA cell 526 may receive inputs generated by the first node 502 and may correspond to the first node 502, a second RA cell 528 may receive inputs from the second node 506 and may correspond to the second node 506, a third RA cell 530 may receive inputs from the third node 510 and may correspond to the third node 510, a fourth RA cell 532 may receive inputs from the fourth node 514 and may correspond to the fourth node 514, and a fifth RA cell 534 may receive inputs from the fifth node 518 and may correspond to the fifth node 518. The RA cells located between the RA cells corresponding to a single node may receive inputs from both of the nodes of which the RA cell are located between. For example, a fifth RA cell 536 located between the first RA cell 526 and the second RA cell 528 may receive inputs from both the first node 502 and the second node 506. Accordingly, the fifth RA cell 536 may correspond to the first node 502 and the second node 506 based on receiving inputs from the first node 502 and the second node 506.

The thermometer code word 524 includes two transition points in the illustrated instance where the value is approximately −0.125, where the values within the thermometer code word 524 transition from a high value (illustrated as a logic 1) to a low value (illustrated as a logic 0) or from a low value to a high value. In particular, the thermometer code word 524 includes a first transition point 538 and a second transition point 540. One of the transition points may indicate a value of the thermometer code word 524, while the other of the transition points may be an invalid transition point.

A thermometer code decoder (such as the thermometer code decoder 246 (FIG. 2)) may determine the value of the thermometer code word 524 based on the transition points and output a digital representation of the value of the thermometer code word 524. In determining the value of the thermometer code word 524, the thermometer code decoder may avoid searching for the transition point at the positions of the thermometer code word 524 where the invalid transition point is located. In particular, the invalid transition point may be located in positions of the thermometer code word 524 produced by the RA cells of the layer 522 that correspond to the nodes provided with values having a difference between the values equal to the difference between a highest value (1 in this instance) and a lowest value (−1 in this instance) of the set of unique values provided to nodes. In the illustrated instance, the third node 510 may receive the value of 1 and the fourth node 514 may receive the value of −1, which have a difference equal to the difference between the highest value and the lowest value of the set of unique values. The thermometer code decoder can avoid searching for the transition point in the positions of the thermometer code word 524 produced by the RA cells corresponding to both the third node 510 and the fourth node 514, which includes the RA cells located between the third RA cell 530 and the fourth RA cell 532. As the thermometer code decoder avoids searching the positions of the thermometer code word produced by the RA cells between the third RA cell 530 and the fourth RA cell 532 for the transition point, the thermometer code decoder may not identify the second transition point 540, which is the invalid transition point in this instance. However, as the thermometer code decoder searches the rest of the positions of the thermometer code word, the thermometer code decoder may identify the first transition point 538, and utilize the first transition point 538 to determine a value of the thermometer code word 524 and, in some embodiments, may produce a digital representation of the value of the thermometer code word 524. The digital representation of the value may comprise a binary representation or another digital protocol representation in some embodiments. In other embodiments, the thermometer code decoder may search all the positions of the thermometer code word 524 for transition points and identify the second transition point 540, but may determine the second transition point 540 is an invalid transition point based on its position within the thermometer code word 524.

The thermometer code decoder may utilize the identified valid transition point (in this instance, the first transition point 538) to determine a value of the thermometer code word 524. In particular, the thermometer code decoder may compare the position of the first transition point 538 with the corresponding nodes and the values provided to the nodes. For example, the thermometer code decoder may determine that the RA cells that output the values that form the portion of the thermometer code word 524 where the first transition point 538 is located corresponds to the first node 502 and the fifth node 518. The thermometer code decoder may further determine that the first node 502 is provided the value of 0 and the fifth node 518 is provided with the value of −0.5. The thermometer code decoder may further determine that the RA cells located between the first RA cell 526 (which corresponds to the first node 502) and the fifth RA cell 534 (which corresponds to the fifth node 518) interpolate between the value provided to the first node 502 and the value provide to the fifth node 518, and may determine the values of each of the RA cells located between the first RA cell 526 and the fifth RA cell 534 provided by the interpolation. For example, the thermometer code decoder may determine that the difference between the values of each of the positions of the thermometer code word 524 located between the first RA cell 526 and the fifth RA cell 534 are uniformly distributed between the values provided to the first node 502 and the fifth node 518, which can be a difference of 0.125. The first transition point 538 may have a transition from 1 to 0 occurring at a first position 542 of the thermometer code word 524 in the illustrated embodiment. The thermometer code decoder may determine that the first position 542 is located between first RA cell 526 corresponding to a value 0 and the fifth RA cell 534 corresponding to the value of −0.5 and one position away from the first RA cell 526. Based on the position of the first position 542, the thermometer code decoder may determine that the first position 542 corresponds to a value that is 0.125 less than the value of the 0 that corresponds to the first RA cell 526, which is −0.125. Based on the transition point and the determined value of the first position 542, the thermometer code decoder may determine that the value of the thermometer code word 524 is −0.125.

As the values provided to each of the nodes change (which may be caused by a change in the value of a dither signal, such as the dither signal on the dither signal input 266 (FIG. 2)), the value corresponding to each of the positions of the thermometer code word 524 may change accordingly. For example, if the first node 502 is provided with the value of 1 and the fifth node 518 is provided with a value of 0.5 in an instance, the first position 542 may correspond to a value of 0.875 instead of −0.125. The positions of the transition points may further change accordingly within the positions of the thermometer code word 524 to maintain the value of the thermometer code word 524. Background adaptation circuitry (such as the background adaptation circuitry 142 (FIG. 1)) may analyze the values indicated by the thermometer code word 524 as the values of the positions of the thermometer code word 524 are changed to determine if any of the RA cells within tree of RA cells, including the layer 522, should be corrected. For example, the background adaptation circuitry may determine whether differences in the values indicated by the thermometer code word 524 exist as the values of the positions are changed and may determine that one or more of the RA cells are to be corrected based on differences existing. Further, the background adaptation circuitry may identify the one or more RA cells that are to be corrected and the correction to be made, and may provide an indication to correction circuitry (such as the correction circuitry 270 (FIG. 2)) or to the RA cells whether RA cells are to be corrected, which RA cells are to be corrected, the corrections to be made, or some combination thereof.

In other embodiments, the thermometer code decoder may count the number of logic 1's and/or logic 0's for determining the value of the thermometer code word 524. In counting the number of logic 1's and/or logic 0's, the thermometer code counter may avoid counting the logic 1's and logic 0's in bit positions of the thermometer code word 524 that correspond to both the third node 510 and the fourth node 514 based on the determination that the difference in the values provided to the third node 510 and the fourth node 514 is equal to the highest value and the lowest value in the set of selected values being provided to the nodes. The bit positions between the third node 510 and the fourth node 514 may act as a loop back between a high end of the thermometer code word 524 and a low end of the thermometer code word 524, where the interpolation performed by the RA cells corresponding to both the third node 510 and the fourth node 514 have different amounts of separation in the interpolation value as compared to the other RA cells producing the thermometer code word 524 and have an inverse value in the change between the RA cells s compared to the other RA cells producing the thermometer code word 524. Based on the number of logic 1's and/or logic 0's the thermometer code decoder may determine the value of the thermometer code word 524. The thermometer code decoder may produce a digital representation of the value of the thermometer code word 524 based on the value of the thermometer code word 524. In some embodiments, the digital representation may comprise a binary representation, although may be other digital protocols in other embodiments. In some embodiments, the thermometer code decoder may not determine an exact value of the thermometer code, but may generate a digital representation of the thermometer code word 524 that indicates a number of logic 1's or logic 0's within the thermometer code word 524.

Figure 6:
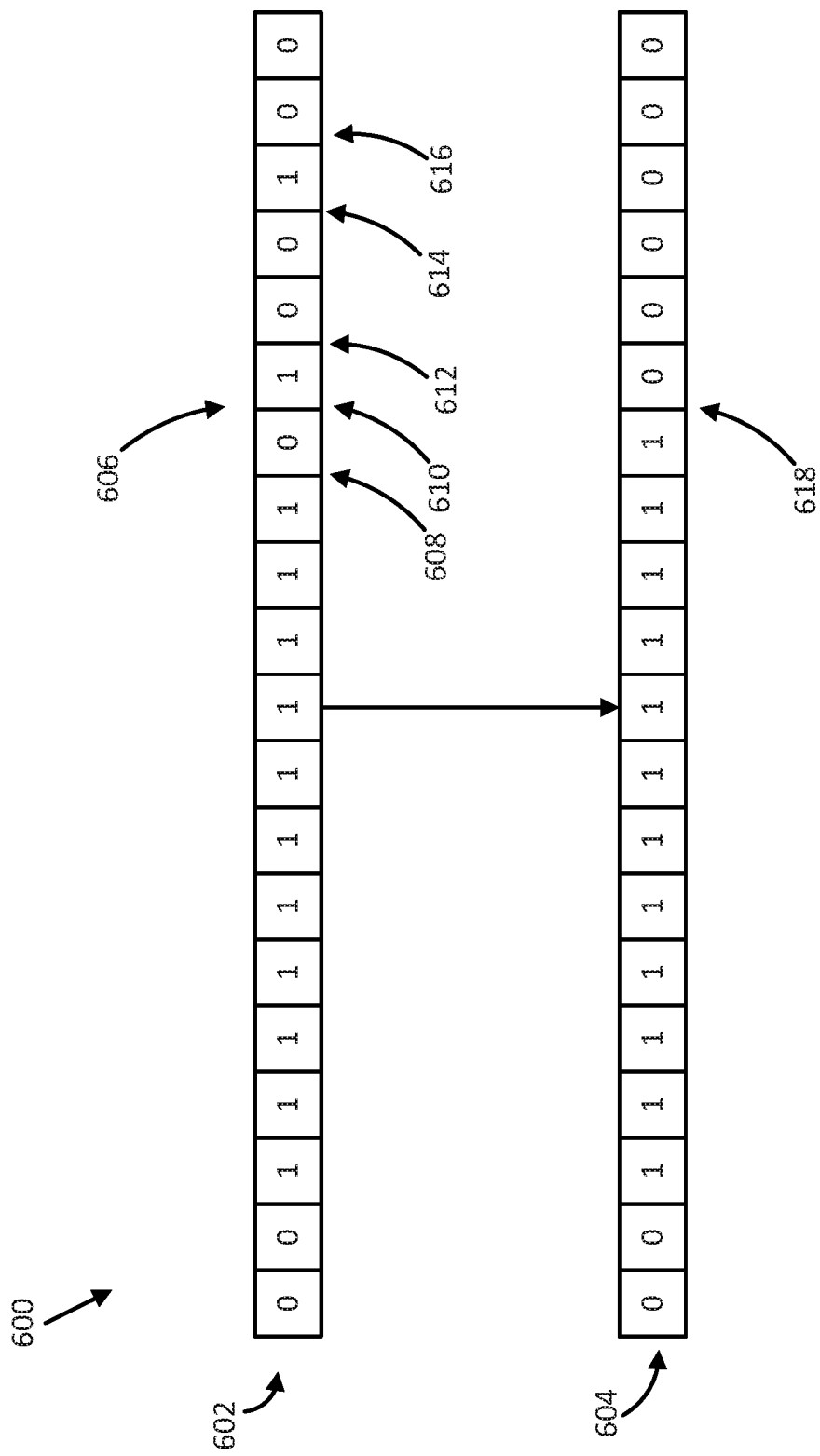
FIG. 6 illustrates an example thermometer code correction instance, according to various embodiments of the disclosure.

FIG. 6 illustrates an example thermometer code correction instance 600, according to various embodiments of the disclosure. In particular, the thermometer code correction instance 600 indicates a first thermometer code word 602 presenting an imprecise transition point 606 and a second thermometer code word 604 that results from correction of the first thermometer code word 602 with the imprecise transition point 606. The first thermometer code word 602 and the second thermometer code word 604 may be produced by a tree of RA cells, such as the tree of RA cells 224 (FIG. 2). The thermometer code correction instance 600 may be implemented by ADC circuitry, such as the ADC circuitry 100 (FIG. 1).

As previously described, a transition point within a thermometer code word may comprise a transition from logic 1's to logic 0's or from logic 0's to logic 1's within the thermometer code word. Generally, it is desired to have a transition point that precisely changes values at a single point within the thermometer code word. An imprecise transition point, such as the imprecise transition point 606 may present multiple transitions between the logic 1's and logic 0's at a transition point rather than a single transition of the values at the transition point. For example, the imprecise transition point 606 may include a first transition 608 from logic 1 to logic 0, a second transition 610 from logic 0 to logic 1, a third transition 612 from logic 1 to logic 0, a fourth transition 614 from logic 0 to logic 1, and a fifth transition 616 from logic 1 to logic 0 in the illustrated embodiment.

A thermometer code decoder (such as the thermometer code decoder 246 (FIG. 2)) or background adaptation circuitry (such as the background adaptation circuitry 142 (FIG. 1)) that receives the first thermometer code word 602 may identify the imprecise transition point 606 and determine that the imprecise transition point 606 is an imprecise transition point. The background adaptation circuitry may determine which RA cells within tree RA cells should be corrected to correct the imprecise transition point 606 such that a transition point with a single transition is produced. The background adaptation circuitry may determine where the single transition should be located based on a frequency of the transitions included in the imprecise transition point 606, based on a comparison between the first thermometer code word 602 and another thermometer code word produced by processing the same input signal that produced the first thermometer code word 602 (for example, the first thermometer code word 602 may have been produced by the first PIADC 106 (FIG. 1) and the other thermometer code word may have been produced by the second PIADC 108 (FIG. 1)), or some combination thereof. In some embodiments, the background adaptation circuitry may determine where the single transition should be based on previous samples processed by the tree of RA cells. The background adaptation circuitry may generate an indication of the RA cells to be corrected and the correction to be made, and can provide the indication to the RA cells that produce the first thermometer code word 602 to implement appropriate corrections of the RA cells to correct or sharpen the imprecise transition point 606.

The second thermometer code word 604 may be produced by the same tree of RA cells that produced the first thermometer code word 602, where the second thermometer code word 604 may be produced after the RA cells have been corrected and the tree of RA cells may receive the same input signal for producing the second thermometer code word 604 that produced the first thermometer code word 602. The corrections to the RA cells within the tree of RA cells may cause the second thermometer code word 604 to produce a precise transition point 618, where the second thermometer code word 604 may comprise a proper thermometer code word based on the input signal.

FIG. 7 illustrates another example thermometer code correction instance 700, according to various embodiments of the disclosure. In particular, the thermometer code correction instance 700 indicates a first thermometer code word 702 that may be produced by a tree of RA cells (such as the tree of RA cells 224 (FIG. 2)) of a first PIADC (such as the first PIADC 106 (FIG. 1)) and a second thermometer code word 704 that may be produced by a tree of RA cells (such as the tree of RA cells 224 (FIG. 2)) of a second PIADC dual-coupled in a system with the first PIADC (such as the second PIADC 108 (FIG. 1)) based on a processing of an input signal.

The first thermometer code word 702 may have a transition point 706 and the second thermometer code word 704 may have a transition point 708. As can be seen, the transition point 706 of the first thermometer code word 702 differs from the transition point 708 of the second thermometer code word 704 by one position. Due to the difference in the positions of the transition point 706 and the transition point 708, the first thermometer code word 702 may have a different value than the second thermometer code word 704 even though both the first PIADC and the second PIADC received the same input.

A background adaptation circuitry (such as the background adaptation circuitry 142 (FIG. 1)) may identify the difference between the two values and may determine that one or more the RA cells within the first PIADC and/or the second PIADC should be corrected based on the difference. The background adaptation circuitry may determine which of the RA cells are to be corrected and/or the correction to be made, and may provide an indication of the RA cells to be corrected and/or the correction to be made to the first PIADC and/or the second PIADC. The background adaptation circuitry may determine the RA cells to be corrected and/or the correction to be made based on the first thermometer code word 702, the second thermometer code word 704, the difference between the first thermometer code word 702 and the second thermometer code word 704, prior thermometer code words produced by the first PIADC and/or the second PIADC, or some combination thereof.

The thermometer code correction instance 700 further indicates a third thermometer code word 710 and a fourth thermometer code word 712. The third thermometer code word 710 may be produced by the tree of RA cells of the first PIADC after the RA cells have been corrected and with the same input signal. Further, the fourth thermometer code word 712 may be produced by the tree of RA cells of the second PIADC after the RA cells have been corrected and with the same input signal. As can be seen, the correction of the RA cells may cause a transition point 714 of the third thermometer code word 710 to be shifted by one position from the transition point 706 of the first thermometer code word 702. The shift of transition point 714 may cause the position of the transition point 714 to match a position of a transition point 716 of the fourth thermometer code word 712. The background adaptation circuitry may determine that the third thermometer code word 710 and the fourth thermometer code word 712 match and, therefore, that none of the RA cells need to be corrected based on the third thermometer code word 710 and the fourth thermometer code word 712.

In some embodiments or instances, the process of correcting the RA cells, and/or the first PIADC and/or the second PIADC may be performed in an iterative process. In some embodiments or instances, the background adaptation circuitry may provide one or more indications of RA cells to be corrected and/or the correction to be made to the first PIADC and/or the second PIADC, where the one or more indications may be based on a prediction of the RA cells to be corrected and/or the correction to be made to the first PIADC and/or the second PIADC. For example, a first indication of the RA cells to be corrected and/or the correction to be made to the first PIADC and/or the second PIADC may be provided by the background adaptation circuitry. After the corrections have been performed in response to the first indication, the background adaptation circuitry may determine whether the corrections have caused the proper thermometer code word to be generated. If the corrections were determined not have caused the proper thermometer code word to be generated, the background adaptation circuitry may provide a second indication of the RA cells to be corrected and/or a correction to be made to the first PIADC and/or the second PIADC to attempt to cause the proper thermometer code word to be generated. The process may be iterative where indications are provided until it is determined that the proper thermometer code word has been provided. The iterative process may occur over multiple samples, where one or more indications may be provided with each sample. Over the iterations, which RA cells are to be corrected and the corrections to be made may be determined and implemented until the proper thermometer code is produced.

EXAMPLE IMPLEMENTATIONS

The following examples are provided by way of illustration.

Example 1 may include a pipelined-interpolating analog-to-digital converter (PIADC), comprising a plurality of nodes to receive a combined signal having an analog input signal and a dither signal, wherein the plurality of nodes includes a first node to output a first difference between a first selected value and the combined signal on a first output of the plurality of nodes, a second node to output a second difference between a second selected value and the combined signal on a second output of the plurality of nodes, and a third node to output a third difference between a third selected value and the combined signal on a third output of the plurality of nodes, wherein the first selected value, the second selected value, and the third selected value are selected from a set of unique values based on a rotational shuffling scheme and the dither signal, and a tree of regenerative amplification cells coupled to the first output, the second output, and the third output of the plurality of nodes, wherein the tree is to produce a thermometer code word corresponding to the combined signal, wherein the tree is to receive an indication whether any of the regenerative amplification cells are to be corrected based on the thermometer code word.

Example 2 may include the PIADC of example 1, wherein the first selected value is selected from the set of unique values for the first node based on the dither signal, the second selected value is selected from the set of unique values for the second node based on the dither signal, and wherein the third selected value is selected from the set of unique values for the third node based on the dither signal.

Example 3 may include the PIADC of example 1, wherein a value of the thermometer code word is determined based on a transition point of outputs of the tree that form the thermometer code word, wherein each output of the outputs of the tree corresponds to corresponding nodes of the plurality of nodes, wherein a first end node and a second end node are identified based on a difference between selected values provided to the first end node and the second end node being equal to a difference between a highest value and a lowest value from the set of unique values, and wherein each output corresponding to the first end node and the second end node are ignored for identification of the transition point for determination of the value of the thermometer code word.

Example 4 may include the PIADC of example 1, wherein the tree of regenerative amplification cells includes a first layer of regenerative amplification cells and a second layer of regenerative amplification cells, and wherein each regenerative amplification cell in the first layer is coupled to three regenerative amplification cells in the second layer.

Example 5 may include the PIADC of example 1, wherein the rotational shuffling scheme causes different values to be provided to each node within the plurality of nodes, and wherein the values provided to each node within the plurality of nodes is determined based on the dither signal.

Example 6 may include the PIADC of example 5, wherein the set of unique values includes a plurality of values that are consecutive, wherein the first node is adjacent to the second node within the plurality of nodes, and wherein the first selected value and the second selected value are consecutive values with the plurality of values.

Example 7 may include the PIADC of example 1, wherein the thermometer code word includes an imprecise transition point, and wherein the indication whether any of the regenerative amplification cells are to be corrected comprises an indication that at least one of the regenerative amplification cells is to be corrected to correct the imprecise transition point to a precise transition point.

Example 8 may include the PIADC of example 1, wherein the thermometer code word is utilized to produce a first digital representation of the analog input signal, and wherein the indication whether any of the regenerative amplification cells are to be corrected comprises an indication that at least one of the regenerative amplification cells is to be corrected based on the first digital representation of the analog input signal being different than a second digital representation of the analog input signal.

Example 9 may include the PIADC of example 1, wherein the indication whether any of the regenerative amplification cells are to be corrected comprises an indication that a regenerative amplification cell within the tree of regenerative amplification cells is to be corrected, and wherein a first current source and a second current source of the regenerative amplification cell are offset in response to the indication that the regenerative amplification cell is to be corrected.

Example 10 may include analog-to-digital converter (ADC) circuitry, comprising a pipelined-interpolating analog-to-digital converter (PIADC), addition circuitry coupled to an input of the PIADC, the addition circuitry to sum an analog input signal and a dither signal to produce a combined signal and to provide the combined signal to the input of the PIADC, and subtraction circuitry coupled to an output of the PIADC, the subtraction circuitry to subtract the dither signal from an output signal on the output of the PIADC to produce a digital representation of the analog input signal.

Example 11 may include the ADC circuitry of example 10, wherein the addition circuitry utilizes an analog representation of the dither signal to sum the analog input signal with the dither signal, and wherein the subtraction circuitry utilizes a digital representation of the dither signal to subtract the dither signal from the output signal.

Example 12 may include the ADC circuitry of example 10, wherein the PIADC includes a plurality of nodes, wherein each node of the plurality of nodes is to output a difference between the combined signal and a received selected value, and wherein the dither signal determines selected values via a rotational shuffling scheme to be provided to each node of the plurality of nodes, and a tree of regenerative amplification cells coupled to the plurality of nodes, the tree of regenerative amplification cells to receive outputs of the plurality of nodes and produce a thermometer code word corresponding to the analog input signal.

Example 13 may include the ADC circuitry of example 12, wherein the selected values to be provided to each node of the plurality of nodes are selected from a set of unique values, and wherein each node of the plurality of nodes receives a different selected value from other nodes of the plurality of nodes.

Example 14 may include the ADC circuitry of example 10, wherein the digital representation of the analog input signal is a first digital representation of the analog input signal, and wherein the ADC circuitry further comprises background adaptation circuitry coupled to the PIADC, the background adaptation circuitry to receive a result of a comparison between the first digital representation of the analog input signal and a second digital representation of the analog input signal, and to provide an indication whether any regenerative amplification cells of the PIADC are to be corrected based on the result of the comparison between the first digital representation of the analog input signal and the second digital representation of the analog input signal.

Example 15 may include the ADC circuitry of example 14, wherein the PIADC is a first PIADC, wherein the dither signal is a first dither signal, wherein the addition circuitry is a first addition circuitry, wherein the subtraction circuitry is a first subtraction, wherein the combined signal is a first combined signal, wherein the output signal is a first output signal and wherein the PIADC circuitry further comprises a second PIADC, second addition circuitry coupled to the input of the second PIADC, the second addition circuitry to sum the analog input signal and a second dither signal to produce a second combined signal and to provide the combined signal to the input of the second PIADC, and second subtraction circuitry coupled to an output of the second PIADC, the second subtraction circuitry to subtract the second dither signal from a second output signal on the output of the second PIADC to produce the second digital representation of the analog input signal.

Example 16 may include the ADC circuitry of example 15, wherein the indication whether any regenerative amplification cells of the PIADC are to be corrected is an indication whether any regenerative amplification cells of the first PIADC are to be corrected, and wherein the background adaptation circuitry is further to provide an indication whether any regenerative amplification cells of the second PIADC are to be corrected based on the result of the comparison between the first digital representation of the analog input signal and the second digital representation of the analog input signal.

Example 17 may include analog-to-digital converter (ADC) circuitry, comprising a first pipelined-interpolating analog-to-digital converter (PIADC) to receive a first combined signal, the first combined signal having an analog input signal and a first dither signal, wherein the first PIADC is to produce a first thermometer code word based on the first combined signal, the first thermometer code word utilized to produce a first digital representation of the analog input signal, a second PIADC to receive a second combined signal, the second combined signal having the analog input signal and a second dither signal, wherein the second PIADC is to produce a second thermometer code word based on the second combined signal, the second thermometer code word utilized to produce a second digital representation of the analog input signal, and background adaptation circuitry coupled to the first PIADC and the second PIADC, the background adaptation circuitry to generate an indication whether any regenerative cells are to be corrected based on a comparison of the first digital representation of the analog input signal and the second digital representation of the analog input signal.

Example 18 may include the ADC circuitry of example 17, wherein the background adaptation circuitry provides the indication whether any regenerative cells are to be corrected to the first PIADC, and wherein the first PIADC is to implement a correction to at least one regenerative cell of the first PIADC in response to receipt of the indication whether any regenerative cells are to be corrected.

Example 19 may include the ADC circuitry of example 17, wherein the first PIADC includes a plurality of nodes to receive the first combined signal, wherein the plurality of nodes is to produce outputs based on a difference between the first combined signal and corresponding selected values selected based on a rotational shuffling scheme and the first dither signal, and a tree of regenerative amplification cells coupled to the plurality of nodes and to receive the outputs of the plurality of nodes, wherein the tree is to output the first thermometer code word based on the outputs of the plurality of nodes.

Example 20 may include the ADC circuitry of example 17, further comprising first addition circuitry coupled to an input of the first PIADC, the first addition circuitry to sum the analog input signal and an analog representation of the first dither signal to produce the first combined signal, and to provide the first combined signal to the input of the first PIADC, first subtraction circuitry coupled to an output of the first PIADC, the first subtraction circuitry to subtract a digital representation of the first dither signal from a first output signal on the output of the first PIADC to produce the first digital representation of the analog input signal, second addition circuitry coupled to an input of the second PIADC, the second addition circuitry to sum the analog input and an analog representation of the second dither signal to produce the second combined signal, and to provide the second combined signal to the input of the second PIADC, and second subtraction circuitry coupled to an output of the second PIADC, the second subtraction circuitry to subtract a digital representation of the second dither signal from a second output signal on the output of the second PIADC to produce the second digital representation of the analog input signal.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

Note that the activities discussed above with reference to the FIGURES are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

What is claimed is:

1. A pipelined-interpolating analog-to-digital converter (PIADC), comprising:
   a plurality of nodes to receive a combined signal having an analog input signal and a dither signal, wherein the plurality of nodes includes:
      a first node to output a first difference between a first selected value and the combined signal on a first output of the plurality of nodes;
      a second node to output a second difference between a second selected value and the combined signal on a second output of the plurality of nodes; and
      a third node to output a third difference between a third selected value and the combined signal on a third output of the plurality of nodes, wherein the first selected value, the second selected value, and the third selected value are selected from a set of unique values based on a rotational shuffling scheme and the dither signal; and
   a tree of regenerative amplification cells coupled to the first output, the second output, and the third output of the plurality of nodes, wherein the tree is to produce a thermometer code word corresponding to the combined signal, wherein the tree is to receive an indication whether any of the regenerative amplification cells are to be corrected based on the thermometer code word.

2. The PIADC of claim 1, wherein the first selected value is selected from the set of unique values for the first node based on the dither signal, the second selected value is selected from the set of unique values for the second node based on the dither signal, and wherein the third selected value is selected from the set of unique values for the third node based on the dither signal.

3. The PIADC of claim 1, wherein a value of the thermometer code word is determined based on a transition point of outputs of the tree that form the thermometer code word, wherein each output of the outputs of the tree corresponds to corresponding nodes of the plurality of nodes, wherein a first end node and a second end node are identified based on a difference between selected values provided to the first end node and the second end node being equal to a difference between a highest value and a lowest value from the set of unique values, and wherein each output corresponding to the first end node and the second end node are ignored for identification of the transition point for determination of the value of the thermometer code word.

4. The PIADC of claim 1, wherein the tree of regenerative amplification cells includes a first layer of regenerative amplification cells and a second layer of regenerative amplification cells, and wherein each regenerative amplification cell in the first layer is coupled to three regenerative amplification cells in the second layer.

5. The PIADC of claim 1, wherein the rotational shuffling scheme causes different values to be provided to each node within the plurality of nodes, and wherein the values provided to each node within the plurality of nodes is determined based on the dither signal.

6. The PIADC of claim 5, wherein the set of unique values includes a plurality of values that are consecutive, wherein the first node is adjacent to the second node within the plurality of nodes, and wherein the first selected value and the second selected value are consecutive values with the plurality of values.

7. The PIADC of claim 1, wherein the thermometer code word includes an imprecise transition point, and wherein the indication whether any of the regenerative amplification cells are to be corrected comprises an indication that at least one of the regenerative amplification cells is to be corrected to correct the imprecise transition point to a precise transition point.

8. The PIADC of claim 1, wherein the thermometer code word is utilized to produce a first digital representation of the analog input signal, and wherein the indication whether any of the regenerative amplification cells are to be corrected comprises an indication that at least one of the regenerative amplification cells is to be corrected based on the first digital representation of the analog input signal being different than a second digital representation of the analog input signal.

9. The PIADC of claim 1, wherein the indication whether any of the regenerative amplification cells are to be corrected comprises an indication that a regenerative amplification cell within the tree of regenerative amplification cells is to be corrected, and wherein a first current source and a second current source of the regenerative amplification cell are offset in response to the indication that the regenerative amplification cell is to be corrected.

10. Analog-to-digital converter (ADC) circuitry, comprising:
a pipelined-interpolating analog-to-digital converter (PIADC);
addition circuitry coupled to an input of the PIADC, the addition circuitry to sum an analog input signal and a dither signal to produce a combined signal and to provide the combined signal to the input of the PIADC;
subtraction circuitry coupled to an output of the PIADC, the subtraction circuitry to subtract the dither signal from an output signal on the output of the PIADC to produce a digital representation of the analog input signal;
a plurality of nodes, wherein each node of the plurality of nodes is to output a difference between the combined signal and a received selected value, and wherein the dither signal determines selected values via a rotational shuffling scheme to be provided to each node of the plurality of nodes; and
a tree of regenerative amplification cells coupled to the plurality of nodes, the tree of regenerative amplification cells to receive outputs of the plurality of nodes and produce a thermometer code word corresponding to the analog input signal.

11. The ADC circuitry of claim 10, wherein the addition circuitry utilizes an analog representation of the dither signal to sum the analog input signal with the dither signal, and wherein the subtraction circuitry utilizes a digital representation of the dither signal to subtract the dither signal from the output signal.

12. The ADC circuitry of claim 10, wherein the selected values to be provided to each node of the plurality of nodes are selected from a set of unique values, and wherein each node of the plurality of nodes receives a different selected value from other nodes of the plurality of nodes.

13. The ADC circuitry of claim 10, wherein the digital representation of the analog input signal is a first digital representation of the analog input signal, and wherein the ADC circuitry further comprises background adaptation circuitry coupled to the PIADC, the background adaptation circuitry to receive a result of a comparison between the first digital representation of the analog input signal and a second digital representation of the analog input signal, and to provide an indication whether any of the regenerative amplification cells of the PIADC are to be corrected based on the result of the comparison between the first digital representation of the analog input signal and the second digital representation of the analog input signal.

14. The ADC circuitry of claim 13, wherein the PIADC is a first PIADC, wherein the dither signal is a first dither signal, wherein the addition circuitry is a first addition circuitry, wherein the subtraction circuitry is a first subtraction, wherein the combined signal is a first combined signal, wherein the output signal is a first output signal and wherein the PIADC circuitry further comprises:
a second PIADC;
second addition circuitry coupled to the input of the second PIADC, the second addition circuitry to sum the analog input signal and a second dither signal to produce a second combined signal and to provide the combined signal to the input of the second PIADC; and
second subtraction circuitry coupled to an output of the second PIADC, the second subtraction circuitry to subtract the second dither signal from a second output signal on the output of the second PIADC to produce the second digital representation of the analog input signal.

15. The ADC circuitry of claim 14, wherein the indication whether any of the regenerative amplification cells of the PIADC are to be corrected is an indication whether any of the regenerative amplification cells of the first PIADC are to be corrected, and wherein the background adaptation circuitry is further to provide an indication whether any regenerative amplification cells of the second PIADC are to be corrected based on the result of the comparison between the first digital representation of the analog input signal and the second digital representation of the analog input signal.

16. Analog-to-digital converter (ADC) circuitry, comprising:
- a first pipelined-interpolating analog-to-digital converter (PIADC) to receive a first combined signal, the first combined signal having an analog input signal and a first dither signal, wherein the first PIADC includes:
- a plurality of nodes to receive the first combined signal, wherein the plurality of nodes is to produce outputs based on a difference between the first combined signal and corresponding selected values selected based on a rotational shuffling scheme and the first dither signal; and
- a tree of regenerative amplification cells coupled to the plurality of nodes and to receive the outputs of the plurality of nodes, wherein the tree is to output a first thermometer code word based on the outputs of the plurality of nodes, the first thermometer code word utilized to produce a first digital representation of the analog input signal;
- a second PIADC to receive a second combined signal, the second combined signal having the analog input signal and a second dither signal, wherein the second PIADC is to produce a second thermometer code word based on the second combined signal, the second thermometer code word utilized to produce a second digital representation of the analog input signal; and
- background adaptation circuitry coupled to the first PIADC and the second PIADC, the background adaptation circuitry to generate an indication whether any regenerative cells are to be corrected based on a comparison of the first digital representation of the analog input signal and the second digital representation of the analog input signal.

17. The ADC circuitry of claim 16, wherein the background adaptation circuitry provides the indication whether any regenerative cells are to be corrected to the first PIADC, and wherein the first PIADC is to implement a correction to at least one regenerative cell of the first PIADC in response to receipt of the indication whether any regenerative cells are to be corrected.

18. The ADC circuitry of claim 16, further comprising:
- first addition circuitry coupled to an input of the first PIADC, the first addition circuitry to sum the analog input signal and an analog representation of the first dither signal to produce the first combined signal, and to provide the first combined signal to the input of the first PIADC;
- first subtraction circuitry coupled to an output of the first PIADC, the first subtraction circuitry to subtract a digital representation of the first dither signal from a first output signal on the output of the first PIADC to produce the first digital representation of the analog input signal;
- second addition circuitry coupled to an input of the second PIADC, the second addition circuitry to sum the analog input and an analog representation of the second dither signal to produce the second combined signal, and to provide the second combined signal to the input of the second PIADC; and
- second subtraction circuitry coupled to an output of the second PIADC, the second subtraction circuitry to subtract a digital representation of the second dither signal from a second output signal on the output of the second PIADC to produce the second digital representation of the analog input signal.

* * * * *